United States Patent
Ching et al.

(10) Patent No.: US 9,721,955 B2
(45) Date of Patent: Aug. 1, 2017

(54) STRUCTURE AND METHOD FOR SRAM FINFET DEVICE HAVING AN OXIDE FEATURE

(71) Applicant: Taiwan Semiconductor Manufacturing Company, Ltd., Hsin-Chu (TW)

(72) Inventors: Kuo-Cheng Ching, Hsinchu County (TW); Ka-Hing Fung, Hsinchu County (TW); Chih-Sheng Chang, Hsinchu County (TW); Zhiqiang Wu, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/262,378

(22) Filed: Apr. 25, 2014

(65) Prior Publication Data
US 2015/0311212 A1    Oct. 29, 2015

(51) Int. Cl.
*H01L 27/092*     (2006.01)
*H01L 27/11*      (2006.01)
(Continued)

(52) U.S. Cl.
CPC .... *H01L 27/1104* (2013.01); *H01L 21/02532* (2013.01); *H01L 21/0332* (2013.01);
(Continued)

(58) Field of Classification Search
CPC ............. H01L 29/66795; H01L 29/785; H01L 27/1211; H01L 27/0886; H01L 27/0924;
(Continued)

(56) References Cited

U.S. PATENT DOCUMENTS 6,359,311 B1   3/2002  Colinge et al.
6,475,869 B1   11/2002 Yu et al.
(Continued)

FOREIGN PATENT DOCUMENTS

JP   2013515356    5/2013
KR   2015-0082027  7/2015
TW   201409713     3/2014

OTHER PUBLICATIONS

Masanori Tanaka et al., "Abnormal Oxidation Characteristics of SiGe/Si-on-insulator Structures Depending on Piled-Up Ge Fraction at SiO2/SiGe Interface," Journal of Applied Physics 103, 2008, pp. 054909-1 through 054909-5, American Institute of Physics.
(Continued)

*Primary Examiner* — Marcos D Pizarro
(74) *Attorney, Agent, or Firm* — Haynes and Boone, LLP

(57) ABSTRACT

The present disclosure provides an embodiment of a fin-like field-effect transistor (FinFET) device. The device includes a substrate having an n-type FinFET (NFET) region and a p-type FinFET (PFET) region. The device also includes a first and a second fin structures over the substrate in the NFET region and a third fin structure over the substrate in the PFET region. The device also includes a first high-k (HK)/metal gate (MG) stack in the NFET region, including wrapping over a portion of the first fin structure, a first subset of the first source/drain (S/D) features, adjacent to the first HK/MG stack, over the recessed first fin structure and a second subset of the first S/D features partially over the recessed second fin structure and partially over the recessed first fin structure.

21 Claims, 16 Drawing Sheets

(51) Int. Cl.
*H01L 29/161* (2006.01)
*H01L 29/78* (2006.01)
*H01L 21/02* (2006.01)
*H01L 21/033* (2006.01)
*H01L 21/324* (2006.01)
*H01L 21/8238* (2006.01)
*H01L 29/165* (2006.01)
*H01L 29/49* (2006.01)
*H01L 29/66* (2006.01)
*H01L 29/51* (2006.01)

(52) U.S. Cl.
CPC .... *H01L 21/324* (2013.01); *H01L 21/823807* (2013.01); *H01L 21/823814* (2013.01); *H01L 21/823821* (2013.01); *H01L 21/823828* (2013.01); *H01L 27/0924* (2013.01); *H01L 29/161* (2013.01); *H01L 29/165* (2013.01); *H01L 29/495* (2013.01); *H01L 29/4966* (2013.01); *H01L 29/66545* (2013.01); *H01L 21/02236* (2013.01); *H01L 21/02255* (2013.01); *H01L 29/517* (2013.01)

(58) Field of Classification Search
CPC .... H01L 27/11; H01L 27/1104; H01L 29/161; H01L 29/66545; Y10S 257/903
USPC ........................................................ 257/192
See application file for complete search history.

(56) References Cited

U.S. PATENT DOCUMENTS

| | | | |
|---|---|---|---|
| 7,018,876 B2 * | 3/2006 | Mathew et al. | H01L 21/28273 257/E21.209 |
| 7,074,662 B2 | 7/2006 | Lee et al. | |
| 7,078,299 B2 | 7/2006 | Maszara et al. | |
| 7,741,182 B2 | 6/2010 | Van Noort et al. | |
| 7,855,105 B1 | 12/2010 | Jagannathan et al. | |
| 7,939,403 B2 | 5/2011 | Grisham et al. | |
| 8,035,199 B2 * | 10/2011 | Izumida et al. | H01L 29/1054 257/327 |
| 8,455,307 B2 | 6/2013 | Cho | |
| 8,716,074 B2 | 5/2014 | Maszara et al. | |
| 8,759,943 B2 | 6/2014 | Tseng et al. | |
| 8,815,670 B2 | 8/2014 | Basker et al. | |
| 8,883,570 B2 | 11/2014 | Lu | |
| 8,901,607 B2 | 12/2014 | Wang et al. | |
| 8,932,927 B2 | 1/2015 | Zhou et al. | |
| 8,987,790 B2 | 3/2015 | Cheng et al. | |
| 9,006,786 B2 | 4/2015 | Ching et al. | |
| 9,054,189 B1 * | 6/2015 | Kim et al. | H01L 29/7848 |
| 9,209,185 B2 | 12/2015 | Ching et al. | |
| 9,257,559 B2 | 2/2016 | Ching et al. | |
| 9,318,606 B2 | 4/2016 | Wang et al. | |
| 2002/0109182 A1 | 8/2002 | Lee et al. | |
| 2005/0104096 A1 | 5/2005 | Lee et al. | |
| 2005/0112851 A1 | 5/2005 | Lee et al. | |
| 2005/0184316 A1 | 8/2005 | Kim et al. | |
| 2005/0242376 A1 | 11/2005 | Chen et al. | |
| 2005/0272192 A1 | 12/2005 | Oh et al. | |
| 2006/0044915 A1 | 3/2006 | Park et al. | |
| 2006/0076625 A1 | 4/2006 | Lee et al. | |
| 2006/0118876 A1 | 6/2006 | Lee et al. | |
| 2006/0177998 A1 | 8/2006 | Lin et al. | |
| 2007/0057325 A1 | 3/2007 | Hsu et al. | |
| 2008/0079094 A1 | 4/2008 | Jin et al. | |
| 2008/0119020 A1 | 5/2008 | Grisham et al. | |
| 2009/0008705 A1 | 1/2009 | Zhu et al. | |
| 2009/0095980 A1 | 4/2009 | Yu et al. | |
| 2009/0130826 A1 | 5/2009 | Kim et al. | |
| 2009/0294801 A1 | 12/2009 | Harley et al. | |
| 2010/0163842 A1 | 7/2010 | Lai et al. | |
| 2010/0163971 A1 | 7/2010 | Hung et al. | |
| 2010/0207201 A1 | 8/2010 | Masuoka et al. | |
| 2010/0264468 A1 | 10/2010 | Xu | |
| 2011/0049613 A1 | 3/2011 | Yeh et al. | |
| 2011/0073952 A1 | 3/2011 | Kwok et al. | |
| 2011/0081764 A1 | 4/2011 | Maszara et al. | |
| 2011/0108920 A1 | 5/2011 | Basker et al. | |
| 2011/0147711 A1 | 6/2011 | Pillarisetty et al. | |
| 2011/0147811 A1 | 6/2011 | Kavalieros et al. | |
| 2011/0147842 A1 | 6/2011 | Cappellani et al. | |
| 2011/0193141 A1 | 8/2011 | Lin et al. | |
| 2011/0193178 A1 | 8/2011 | Chang et al. | |
| 2011/0193187 A1 | 8/2011 | Nakamura et al. | |
| 2011/0233679 A1 | 9/2011 | Chen et al. | |
| 2012/0086053 A1 | 4/2012 | Tseng et al. | |
| 2012/0193751 A1 | 8/2012 | Kawasaki et al. | |
| 2012/0235224 A1 | 9/2012 | Yeh et al. | |
| 2012/0292672 A1 | 11/2012 | Cho | |
| 2013/0005114 A1 | 1/2013 | Maszara et al. | |
| 2013/0056795 A1 | 3/2013 | Wu et al. | |
| 2013/0102137 A1 | 4/2013 | Jeng | |
| 2013/0113042 A1 | 5/2013 | Wang et al. | |
| 2013/0119482 A1 | 5/2013 | Wann et al. | |
| 2013/0122672 A1 | 5/2013 | Or-Bach et al. | |
| 2013/0175621 A1 | 7/2013 | Chen et al. | |
| 2013/0230953 A1 | 9/2013 | Sudo et al. | |
| 2013/0299875 A1 | 11/2013 | Hang | |
| 2014/0008734 A1 | 1/2014 | Lu | |
| 2014/0015015 A1 | 1/2014 | Krivokapic et al. | |
| 2014/0042526 A1 | 2/2014 | Masuoka et al. | |
| 2014/0120738 A1 * | 5/2014 | Jung et al. | H01L 21/02219 438/778 |
| 2014/0175561 A1 | 6/2014 | Colinge et al. | |
| 2014/0197456 A1 | 7/2014 | Wang et al. | |
| 2014/0197457 A1 | 7/2014 | Wang et al. | |
| 2014/0197458 A1 | 7/2014 | Ching et al. | |
| 2014/0203333 A1 | 7/2014 | Huang et al. | |
| 2014/0203334 A1 | 7/2014 | Colinge et al. | |
| 2014/0217483 A1 | 8/2014 | Choi et al. | |
| 2014/0225219 A1 | 8/2014 | Huang et al. | |
| 2014/0252469 A1 | 9/2014 | Lee et al. | |
| 2014/0264483 A1 | 9/2014 | Yoshida et al. | |
| 2014/0264592 A1 | 9/2014 | Oxland et al. | |
| 2014/0264610 A1 | 9/2014 | Yang et al. | |
| 2014/0283599 A1 | 9/2014 | Kim et al. | |
| 2014/0299934 A1 | 10/2014 | Kim et al. | |
| 2014/0306297 A1 | 10/2014 | Ching et al. | |
| 2014/0312398 A1 | 10/2014 | Ching et al. | |
| 2014/0312432 A1 | 10/2014 | Ching et al. | |
| 2014/0353731 A1 | 12/2014 | Colinge et al. | |
| 2014/0374832 A1 | 12/2014 | Kuoh et al. | |
| 2015/0008483 A1 | 1/2015 | Ching et al. | |
| 2015/0008489 A1 | 1/2015 | Ching et al. | |
| 2015/0021695 A1 | 1/2015 | Hu et al. | |
| 2015/0021697 A1 | 1/2015 | Colinge et al. | |
| 2015/0028426 A1 | 1/2015 | Ching et al. | |
| 2015/0041911 A1 | 2/2015 | Chan et al. | |
| 2015/0060960 A1 | 3/2015 | Xie et al. | |
| 2015/0102424 A1 | 4/2015 | Colinge | |
| 2015/0200300 A1 | 7/2015 | Ching et al. | |
| 2015/0303198 A1 | 10/2015 | Ching et al. | |
| 2015/0303305 A1 | 10/2015 | Ching et al. | |

OTHER PUBLICATIONS

F. K. Legoues, et al., "Kinetics and Mechanism of Oxidation of SiGe: Dry Versus Wet Oxidation," Applied Physics Letters 54, Feb. 13, 1989, pp. 644-646, American Institute of Physics.
U.S. Appl. No. 13/934,992, filed Jul. 3, 2013, by inventors Kuo-Cheng Ching, Chih-Hao Wang, Zhigiang Wu and Carlos H. Diaz for "Fin Structure of Semiconductor Device," 21 pages of text, 12 pages of drawings.
U.S. Appl. No. 13/740,373, filed Jan. 14, 2013, by inventors Chih-Hao Wang, Kuo-Cheng Ching, Gwan Sin Chang, and Zhigiang Wu for "Semiconductor Device and Fabricating the Same," 21 pages of text, 17 pages of drawings.
U.S. Appl. No. 13/902,322, filed May 24, 2013, by inventors Chih-Hao Wang, Kuo-Cheng Ching, Gwan Sin Chang, and Zhiqiang Wu for "FinFET Device and Method of Fabricating Same," 20 pages of text, 15 pages of drawings.

(56) References Cited

OTHER PUBLICATIONS

U.S. Appl. No. 14/155,793, filed Jan. 15, 2014, by inventors Kuo-Cheng Ching, Chih-Hao Wang, Zhiqiang Wu and Carlos H. Diaz for "Semiconductor Device and Formation Thereof," 16 pages of text, 12 pages of drawings.
U.S. Appl. No. 14/254,072, filed Apr. 16, 2014, by inventors Kuo-Cheng Ching, Ka-Hing Fung, Chih-Sheng Chang, Zhiqiang Wu for "A Method and Structure for FinFET Device," 26 pages of text, 14 pages of drawings.
U.S. Appl. No. 14/254,035, filed Apr. 16, 2014, by inventors Kuo-Cheng Ching, Ka-Hing Fung, Chih-Sheng Chang, Zhiqiang Wu for "FinFET Device with High-K Metal Gate Stack," 22 pages of text, 14 pages of drawings.
KIPO, Office Action, Application No. 10-2014-0186780, dated Apr. 4, 2016, 8 pages w/translation.
P. Gas et al., "Diffusion of Sb, Ga, Ge, and (AS) in TiSi2," Journal of Applied Physics, American Institute of Physics, vol. 63, No. 11, Jun. 1, 1988, pp. 5335-5345.
C. Tetelin et al., "Kinetics and Mechanism of Low Temperature Atomic Oxygen-Assisted Oxidation of SiGe Layers," Journal of Applied Physics, American Institute of Physics, vol. 83, No. 5 Mar. 1, 1998, pp. 2842-2846.
Notice of Allowance of Patent dated Aug. 3, 2016, Application No. KR10-2014-0186780, 6 pages.

\* cited by examiner

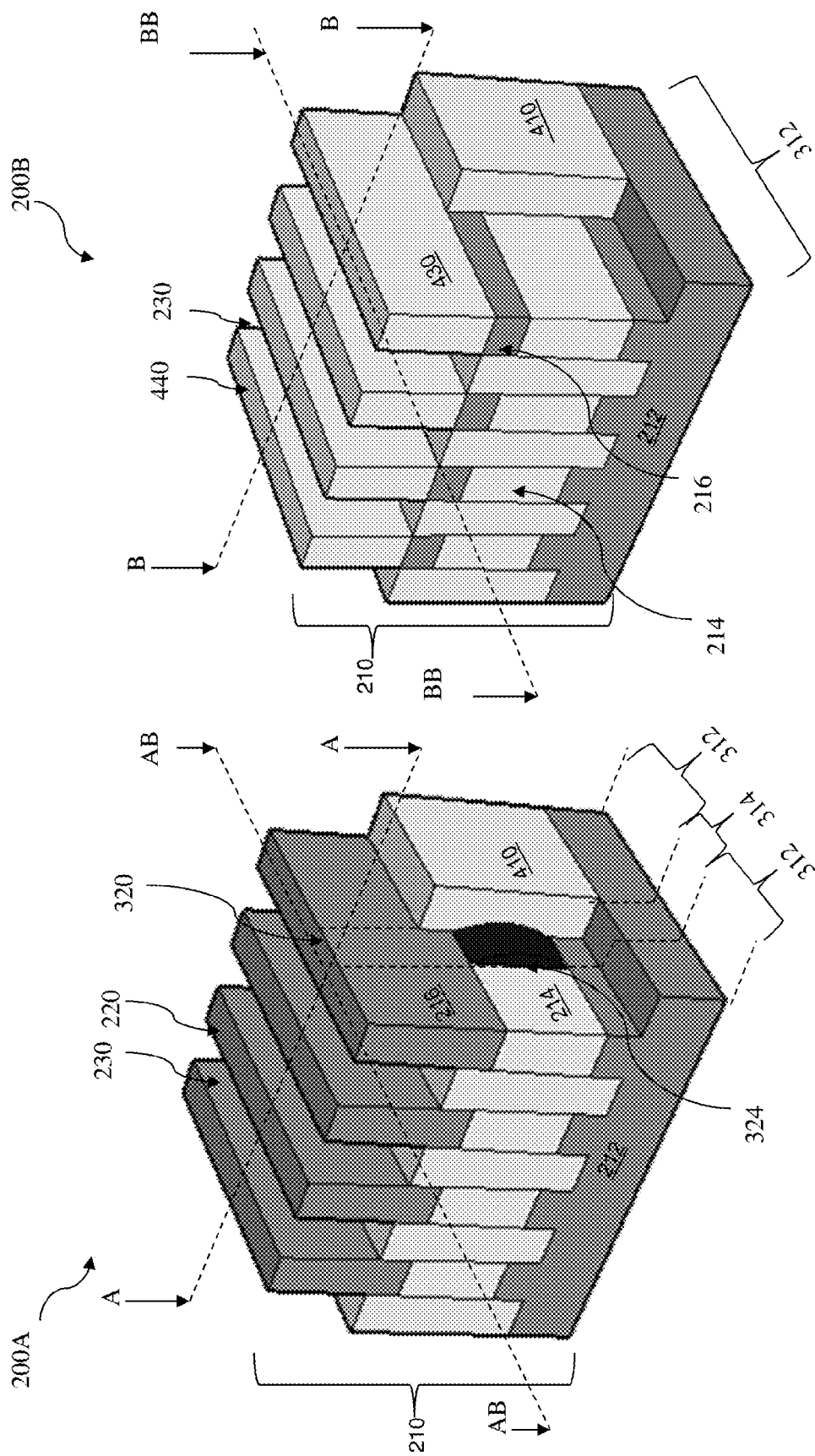

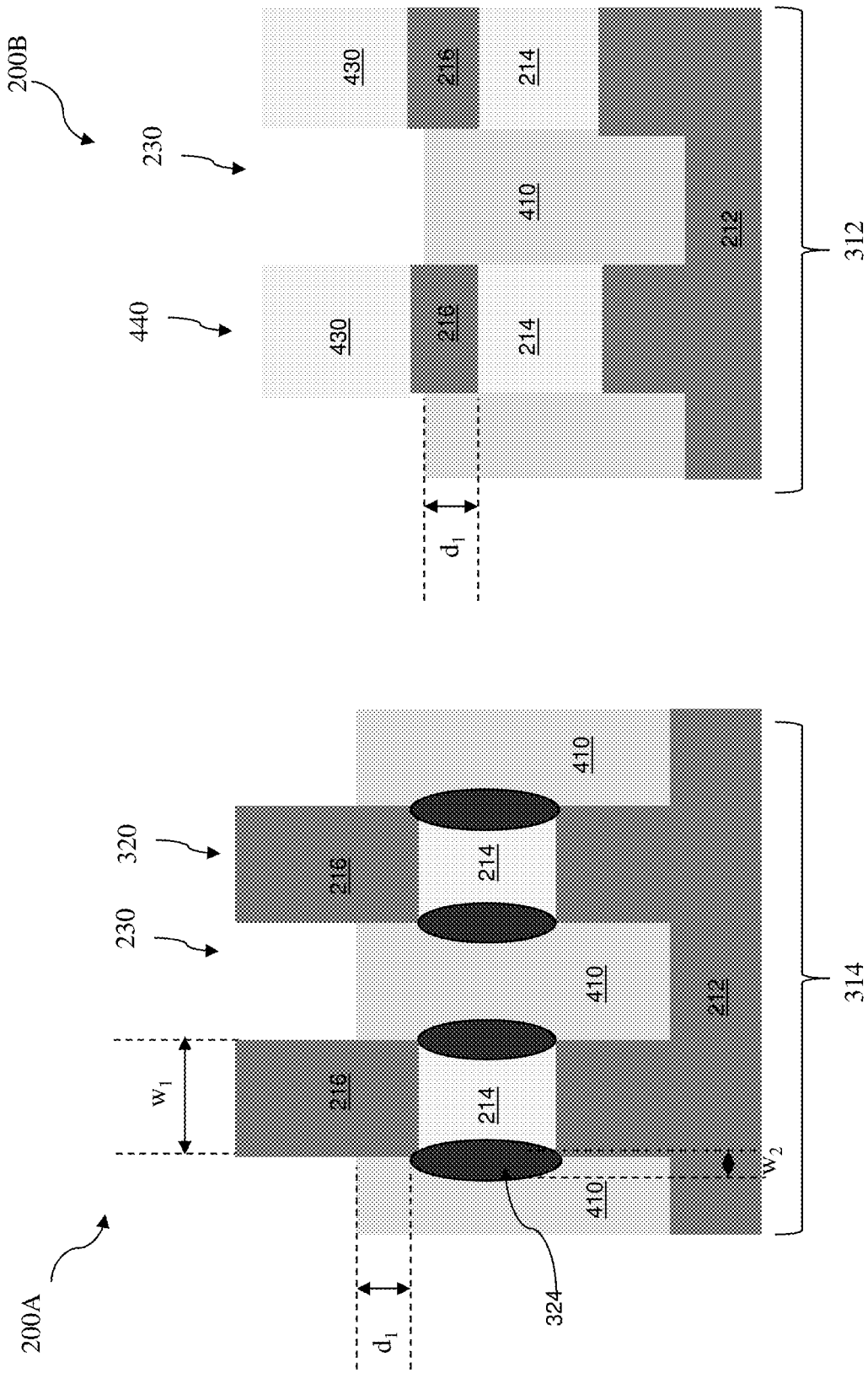

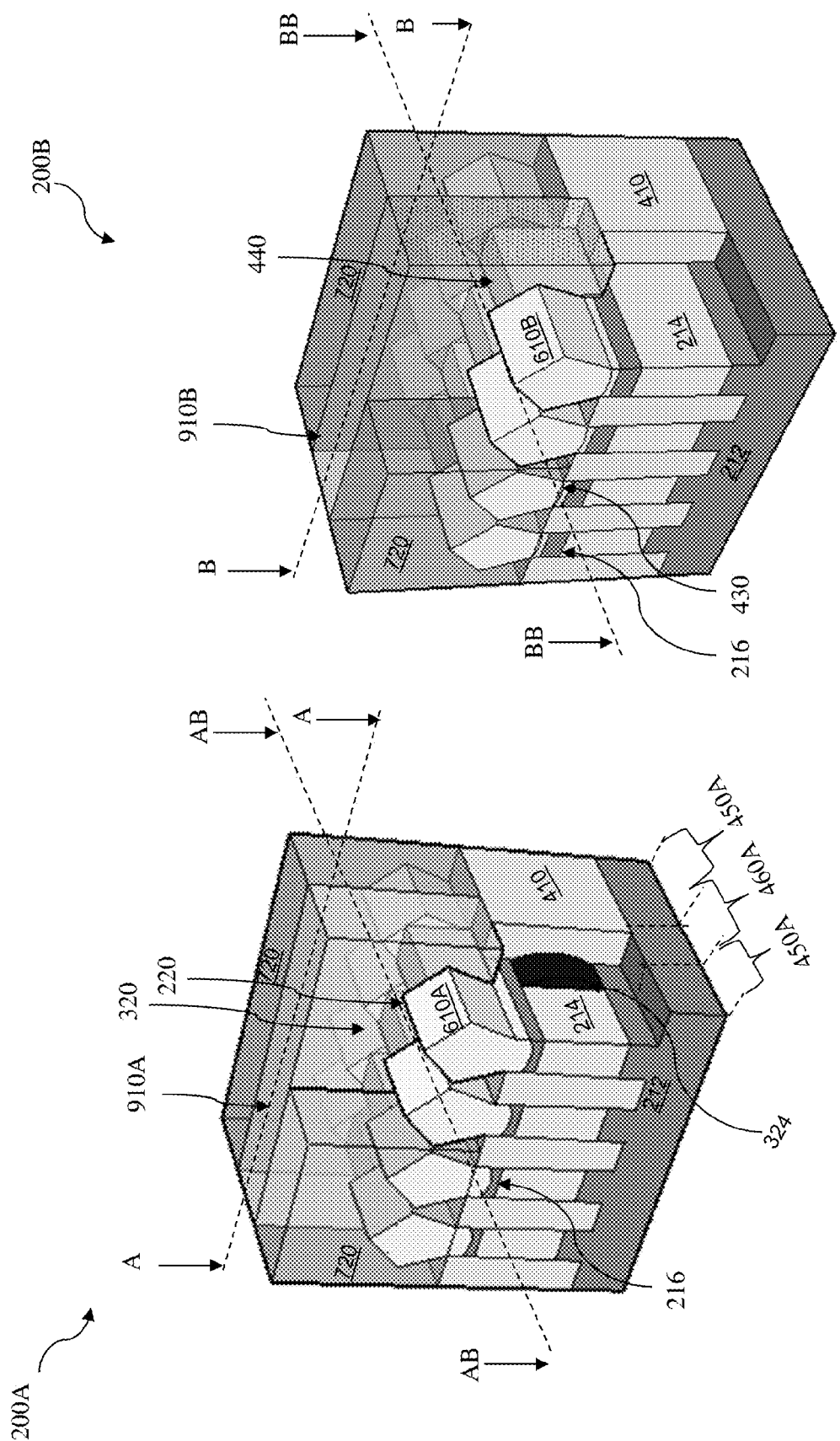

STRUCTURE AND METHOD FOR SRAM FINFET DEVICE HAVING AN OXIDE FEATURE

This application is related to patent applications U.S. Ser. No. 13/740,373 filed on Jan. 14, 2013, as "Semiconductor Device and Fabricating the Same;" U.S. Ser. No. 13/902,322 filed on May 24, 2013, as "FinFET Device and Method of Fabricating Same;" U.S. Ser. No. 13/934,992 filed on Jul. 3, 2013, as "Fin Structure of Semiconductor Device;" and U.S. Ser. No. 14/155,793 filed on Jan. 15, 2014, as "Semiconductor Device and Formation Thereof;" U.S. Ser. No. 14/254,072 filed on Apr. 16, 2014, as "A Method and Structure for FinFET Device;" U.S. Ser. No. 14/254,035 filed on Apr. 16, 2014, as "FinFET Device With High-K Metal Gate Stack", the entire disclosures of which are hereby incorporated by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a static random-access memory (SRAM) fin-like field-effect transistor (FinFET), has been introduced to replace a planar transistor. Although existing FinFET devices and methods of fabricating SARM FinFET devices have been generally adequate for their intended purposes, they have not been entirely satisfactory in all respects.

BRIEF DESCRIPTION OF THE DRAWINGS

Aspects of the present disclosure are best understood from the following detailed description when read in association with the accompanying figures. It is noted that, in accordance with the standard practice in the industry, various features in drawings are not drawn to scale. In fact, the dimensions of illustrated features may be arbitrarily increased or decreased for clarity of discussion.

FIGS. 8A and 8B are diagrammatic perspective views of a SRAM FinFET device undergoing processes in accordance with some embodiments.

FIG. 8C is a cross-sectional view of an example SRAM FinFET device along the line A-A in FIG. 8A at fabrication stages constructed according to the method of FIG. 1.

FIG. 8D is a cross-sectional view of an example SRAM FinFET device along the line B-B in FIG. 8B at fabrication stages constructed according to the method of FIG. 1.

FIGS. 12A and 12B are diagrammatic perspective views of a SRAM FinFET device undergoing processes in accordance with some embodiments.

DETAILED DESCRIPTION

Figure 1:
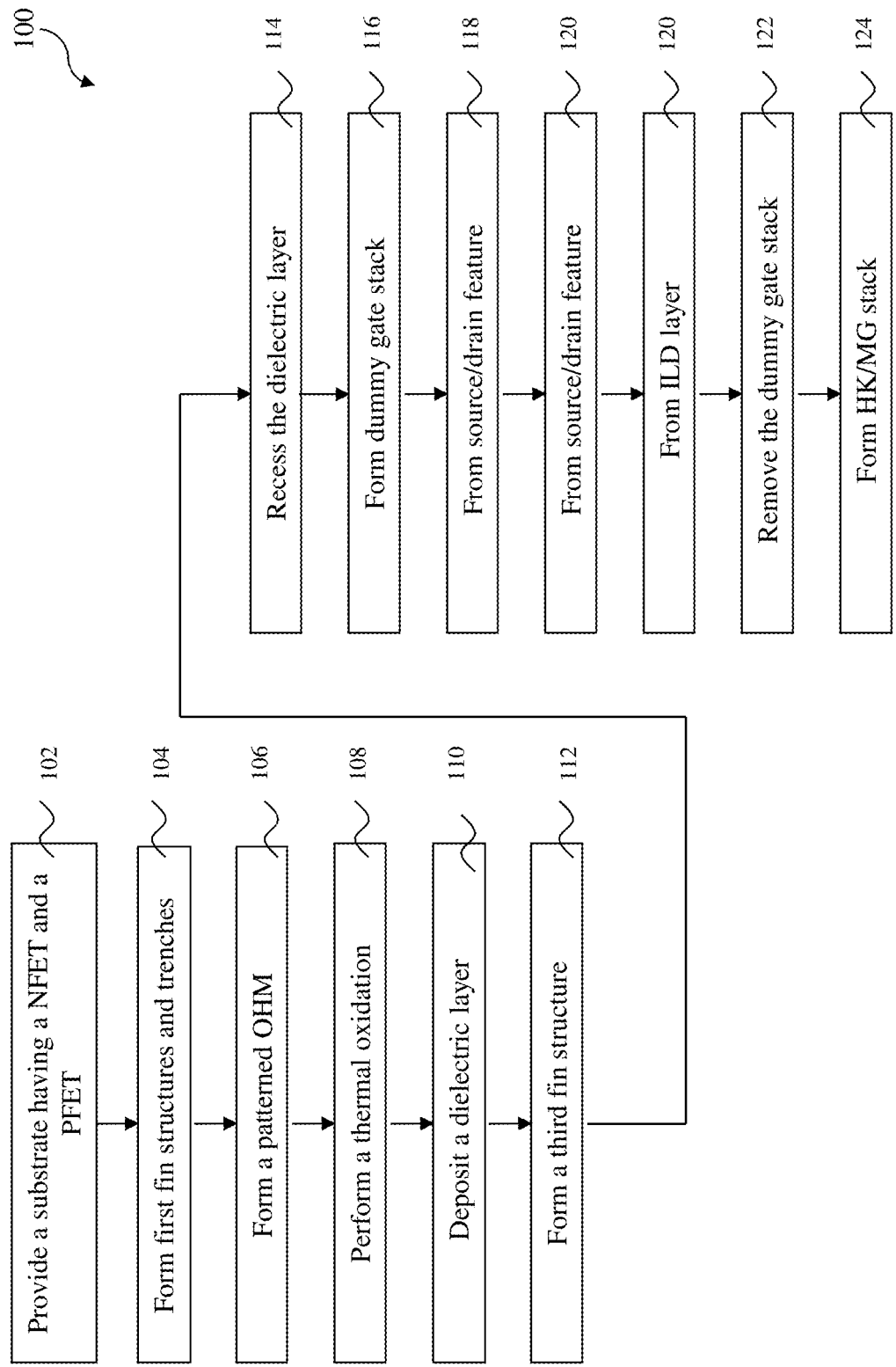
FIG. 1 is a flow chart of an example method for fabricating a SRAM FinFET device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with a FinFET example to illustrate various embodiments of the present invention. It is understood, however, that the application should not be limited to a particular type of device, except as specifically claimed.

FIG. 1 is a flowchart of a method 100 for fabricating a SRAM FinFET device 200 in accordance with some embodiments. It is understood that additional steps may be implemented before, during, and after the method, and some of the steps described may be replaced or eliminated for other embodiments of the method. The SRAM FinFET device 200 and the method 100 making the same are collectively described with reference to various figures.

Figure 2B:
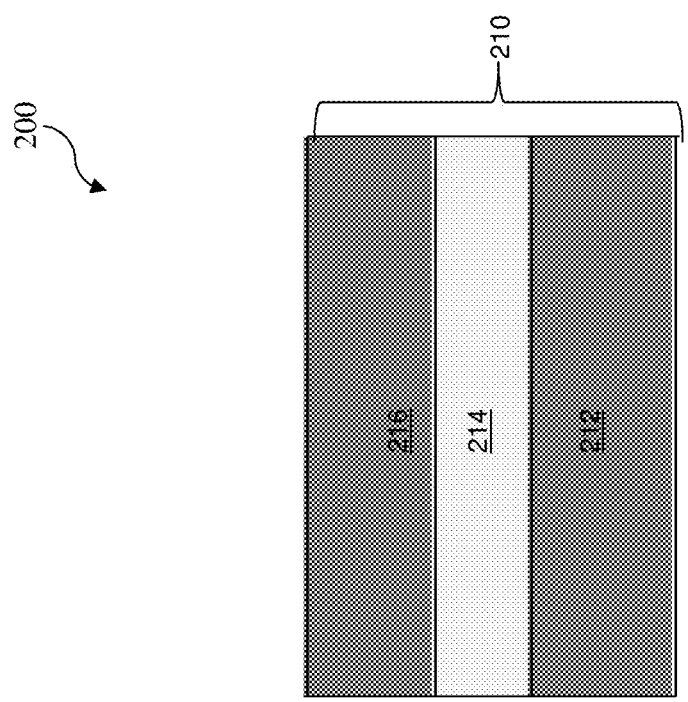
FIG. 2B is a cross-sectional view of an example FinFET device along the line A-A in FIG. 2A at fabrication stages constructed according to the method of FIG. 1.
Figure 2A:
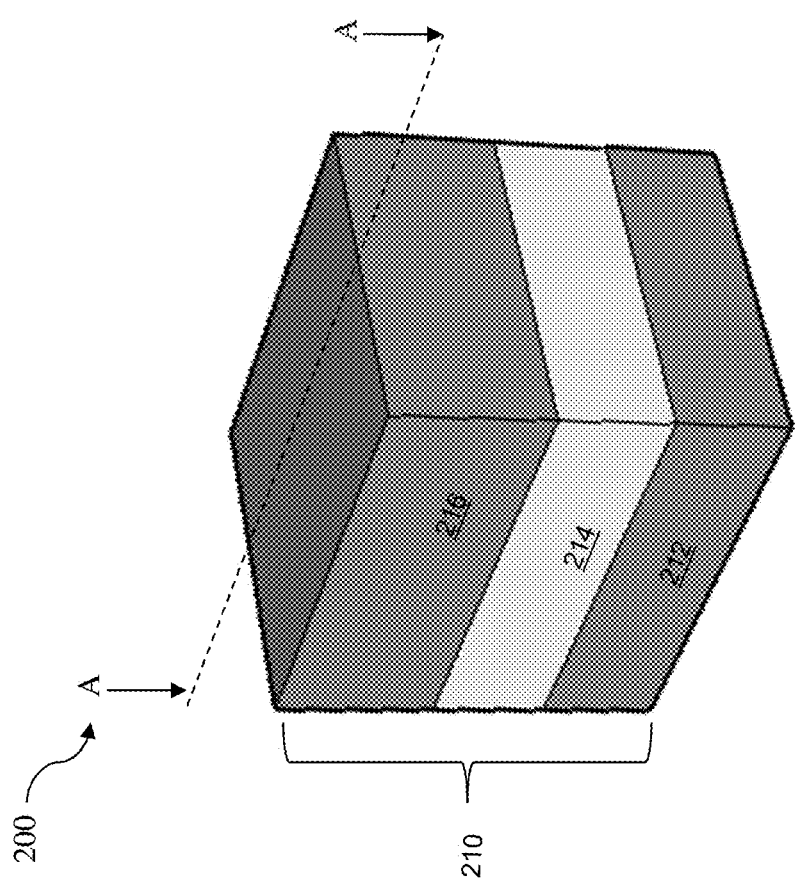
FIG. 2A is a diagrammatic perspective view of an example SRAM FinFET device undergoing processes in accordance with some embodiments.

Referring to FIGS. 1 and 2A-2B, the method 100 begins at step 102 by providing a substrate 210. The substrate 210 may include a bulk silicon substrate. Alternatively, the substrate 210 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof.

In another embodiment, the substrate 210 has a silicon-on-insulator (SOI) structure with an insulator layer in the substrate. An exemplary insulator layer may be a buried oxide layer (BOX). The SOI substrate may be fabricated using separation by implantation of oxygen (SIMOX), wafer bonding, and/or other suitable methods.

In the present embodiment, the substrate 210 includes a first semiconductor material layer 212, a second semiconductor material layer 214 disposed over the first semiconductor material layer 212 and a third semiconductor material layer 216 disposed over the second semiconductor material layer 214. The second and third semiconductor material layers, 214 and 216, are different from each other. The second semiconductor material layer 214 has a first lattice constant and the third semiconductor material layer 416 has a second lattice constant different from the first lattice constant. In the present embodiment, the second semiconductor material layer 214 includes silicon germanium (SiGe), and both of the first and the third semiconductor material layers, 212 and 216, include silicon. In various examples, the first, the second and the third semiconductor material layers, 212, 214 and 216, may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the second and the third semiconductor material layers, 214 and 216, are deposited by epitaxial growth, referred to as a blanket channel epi. In various examples, the epitaxial processes include CVD deposition techniques (e.g., vapor-phase epitaxy (VPE) and/or ultra-high vacuum CVD (UHV-CVD)), molecular beam epitaxy, and/or other suitable processes.

The substrate 210 may include various doped features depending on design requirements as known in the art. In some embodiment, the substrate 210 may include various doped regions depending on design requirements (e.g., p-type substrate or n-type substrate). In some embodiment, the doped regions may be doped with p-type or n-type dopants. For example, the doped regions may be doped with p-type dopants, such as boron or $BF_2$; n-type dopants, such as phosphorus or arsenic, and/or combination thereof. The doped regions may be configured for an n-type FinFET (NFET), or alternatively configured for a p-type FinFET (PFET).

Figure 3B:
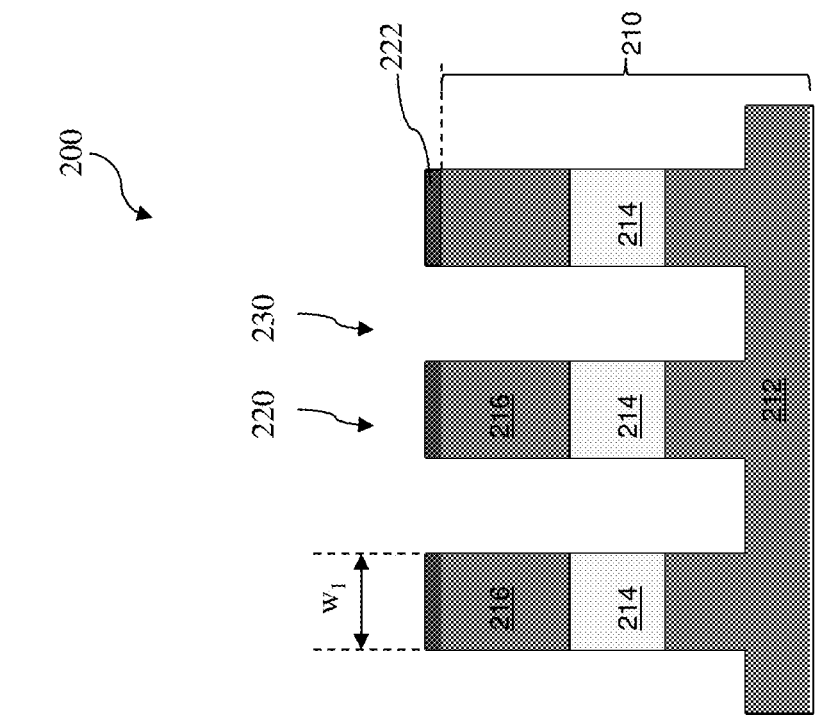
FIG. 3B is a cross-sectional view of an example SRAM FinFET device alone the line A-A in FIG. 3A at fabrication stages constructed according to the method of FIG. 1.
Figure 3A:
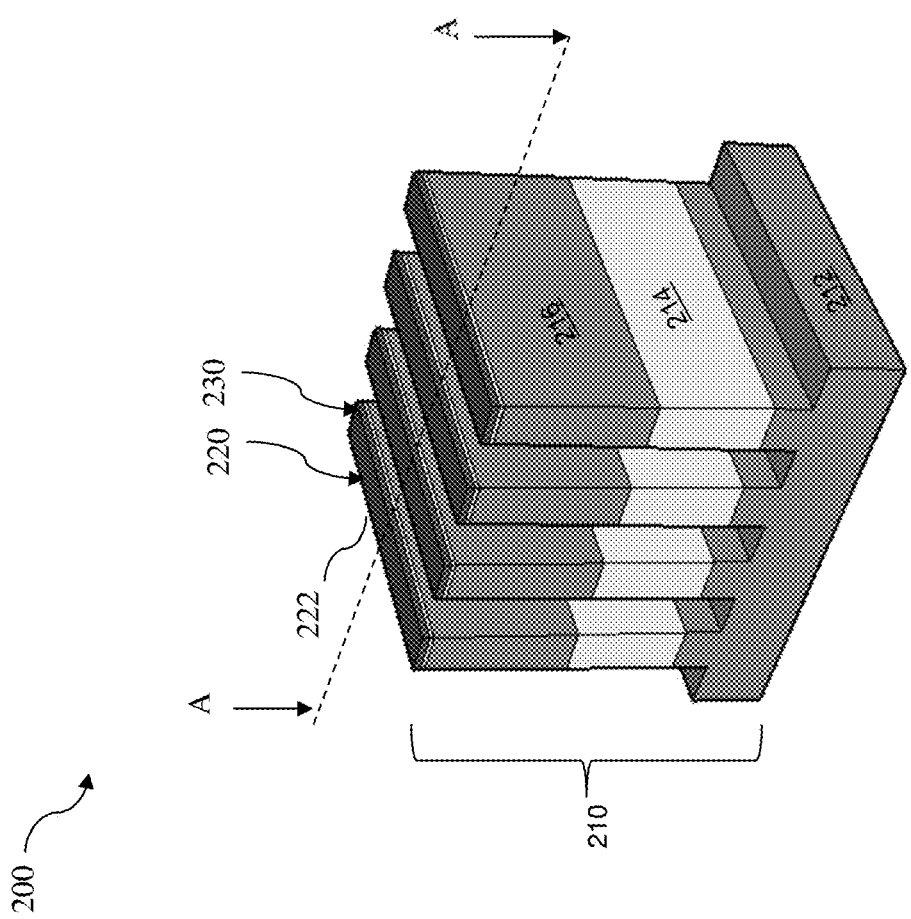
FIG. 3A is a diagrammatic perspective view of an example SRAM FinFET device undergoing processes in accordance with some embodiments.

Referring to FIGS. 1 and 3A-3B, the method 100 proceeds to step 104 by forming first fins structure 220 and trenches 230 in the substrate 210. The first fin structure 220 has a first width $w_1$ in a range of about 4 nm to about 10 nm. In one embodiment, a patterned fin hard mask (FHM) layer 222 is formed over the substrate 210. The patterned FHM layer 222 includes silicon oxide, silicon nitride, silicon oxynitride, or any other suitable dielectric material. The patterned hard mask layer 222 may include a single material layer or multiple material layers. The patterned FHM layer 222 may be formed by depositing a material layer by thermal oxidation, chemical vapor deposition (CVD), atomic layer deposition (ALD), or any other appropriate method, forming a patterned photoresist (resist) layer by a lithography process, and etching the material layer through the openings of the patterned photoresist layer to form the patterned FHM layer 222.

An exemplary photolithography process may include forming a photoresist layer, exposing the resist by a lithography exposure process, performing a post-exposure bake process, and developing the photoresist layer to form the patterned photoresist layer. The lithography process may be alternatively replaced by other technique, such as e-beam writing, ion-beam writing, maskless patterning or molecular printing.

The substrate 210 is then etched through the patterned FHM layer 222 to form the first fins structure 220 and the trenches 230 in the substrate 210. In another embodiment, the patterned photoresist layer is directly used the patterned FHM layer 222 as an etch mask of the etch process to form the first fins structure 220 and the trenches 230 in the substrate 210. The etching process may include a wet etch or a dry etch. In one embodiment, the wet etching solution includes a tetramethylammonium hydroxide (TMAH), a HF/HNO3/CH3COOH solution, or other suitable solution. The respective etch process may be tuned with various etching parameters, such as etchant used, etching temperature, etching solution concentration, etching pressure, source power, RF bias voltage, RF bias power, etchant flow rate, and/or other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etchant gasses include $CF_4$, $NF_3$, $SF_6$, and He. Dry etching may also be performed anisotropically using such mechanism as DRIE (deep reactive-ion etching).

In the present embodiment, the etching depth is controlled such that the third and the second semiconductor material layers, 216 and 214 are exposed but the first semiconductor material layer 212 is partially exposed in the trench 230. Thus the first fin structure 220 is formed to have the third semiconductor material layer 216 as an upper portion, the second semiconductor material layer 214 as a middle portion and the first semiconductor material layer 212 as a bottom portion.

In some embodiment, the SRAM FinFET device 200 includes an n-type FinFET (NFET) device, designated with the reference numeral 200A and referred to as the SRAM FinFET device 200A. The SRAM FinFET device 200 also includes a PFET device, designated with the reference numeral 200B and referred to as the SRAM FinFET device 200B.

Figures 4A, 4B:
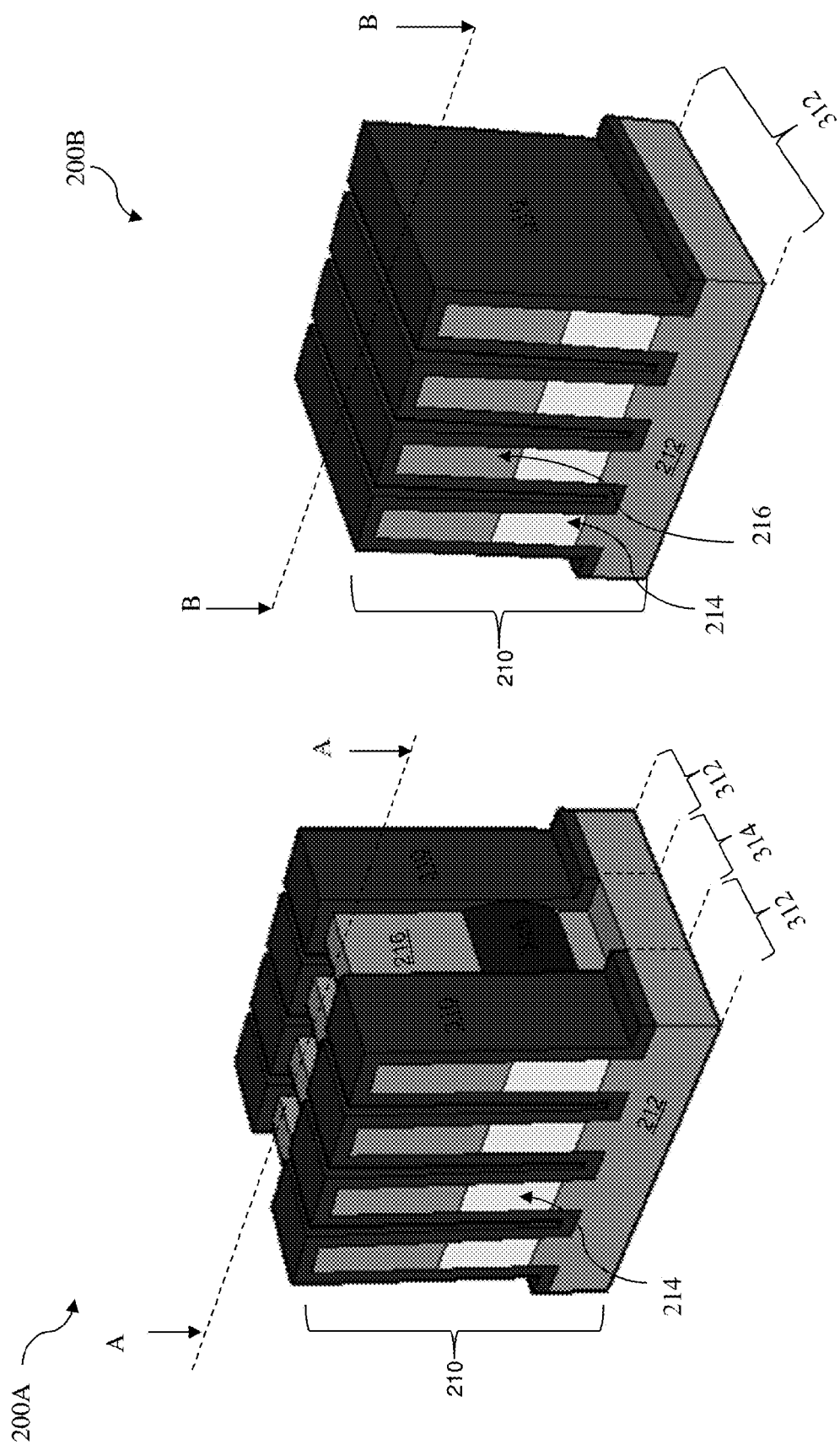
FIGS. 4A and 4B are diagrammatic perspective views of a SRAM FinFET device undergoing processes in accordance with some embodiments.

Referring to FIGS. 1 and 4A-4B, the method 100 proceeds to step 106 by forming a patterned oxidation-hardmask (OHM) 310 over the substrate 210, including wrapping a portion of the first fin structures 220. In the present embodiment, in the NFET 200A, the patterned OHM 310 covers a first region 312 and exposes a second region 314 in the substrate 210. In the PFET 200B, the patterned OHM 310 wraps the whole first fins structure 220. The patterned OHM layer 310 may include silicon oxide, silicon nitride, silicon oxynitride, or any other suitable dielectric material. The patterned OHM layer 310 may be formed by depositing a material layer by thermal oxidation, chemical CVD, ALD, or any other appropriate method, forming a patterned photoresist (resist) layer by a lithography process, and etching the material layer through the openings of the patterned photoresist layer to form the patterned OHM layer 310.

Figure 5:
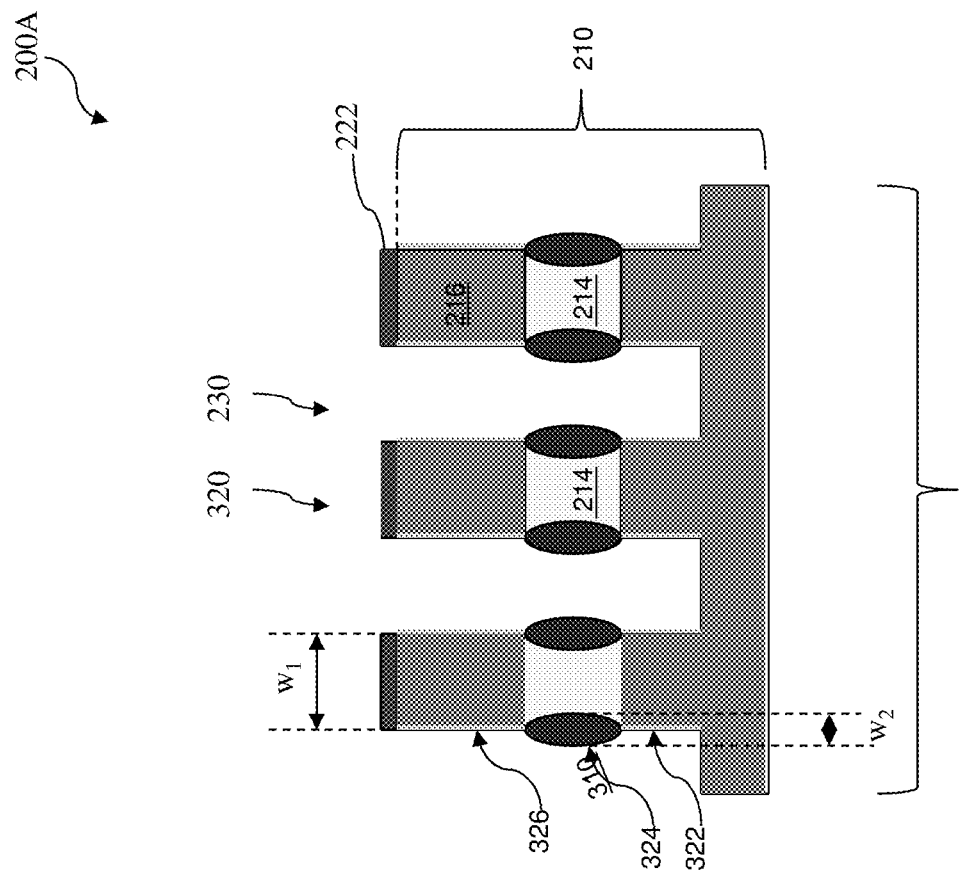
FIG. 5 is a cross-sectional view of an example SRAM FinFET device along the line A-A in FIG. 4A at fabrication stages constructed according to the method of FIG. 1.

Referring also to FIGS. 1, 4A and 5, the method 100 proceeds to step 108 by performing a thermal oxidation process to the SRAM FinFET device 200. In one embodiment, the thermal oxidation process is conducted in oxygen ambient. In another embodiment, the thermal oxidation process is conducted in a combination of steam ambient and oxygen ambient. In the second region 314 of the NFET 200A, during the thermal oxidation process, at least outer layers of the first, the second and the third semiconductor material layers, 212, 214 and 216, convert to a first, second and a third semiconductor oxide features 322, 324 and 326, respectively. While in the first region 312 of the NFET 200A, as well as entire the PFET 200B, the patterned OHM 310 prevents the first fin structure 220, to be oxidized. Therefore, the thermal oxidation process is referred to as a selective oxidation.

After the thermal oxidation process, the first fin structure 220 in the second region 324 has a different structure than those in the first region 312. For the sake of clarity to better description, the first fin structure 220 in the second region 214 (having the second semiconductor oxide feature 324) is referred to as a second fin structure 320. Thus the second fin structure 320 has the third semiconductor material layer 216 as its upper portion, the second semiconductor material layer 214, with the second semiconductor oxide feature 324 at its outer layer, as its middle portion and the first semiconductor material layer as its bottom portion.

In the present embodiment, the thermal oxidation process is controlled such that the second semiconductor material layer 214 oxidizes much faster that the first and third semiconductor material layers, 212 and 216. In another words, comparing to the second semiconductor oxide feature 324, the first and third semiconductor oxide features, 322 and 326, are quite thin. As an example, the thermal oxidation process to the SRAM FinFET device 200 is performed in a $H_2O$ reaction gas with a temperature ranging from about 400° C. to about 600° C. and under a pressure ranging from about 1 atm. to about 20 atm. After the oxidation process, a cleaning process is performed to remove the first and the third semiconductor oxide features, 322 and 326. The cleaning process may be performed using diluted hydrofluoric (DHF) acid.

In the present example, the second semiconductor oxide features 324 extends in the vertical direction with a horizontal dimension varying from the top surface to the bottom surface of the second semiconductor material layer 214. In furtherance of the present example, the horizontal dimension of the second semiconductor oxide features 324 reaches its maximum, referred to as a first width $w_1$, and decreases to close to zero when approaches to the top and bottom surfaces of the second semiconductor oxide features 324, resulting in an olive shape in a cross-sectional view. By tuning of the thermal oxidation process, selecting a composition and thickness of the second semiconductor material layer 214 and tuning the oxidation temperature, it achieves a target second width $w_2$ of the second semiconductor oxide feature 324, which applies an adequate stress to the third semiconductor material layer 216 in the first fin structure 220, where a gate channel is to be defined underlying a gate region, which will be described later.

In one embodiment, the second semiconductor material layer 214 includes silicon germanium ($SiGe_{x_1}$) and both of the first and the third semiconductor material layers, 212 and 216, include silicon (Si). The subscript $x_1$ is a first Ge composition in atomic percent and it may be adjusted to meet a predetermined volume expansion target. In one embodiment, $x_1$ is selected in a range from about 20% to about 85%. An outer layer of the $SiGe_{x_1}$ layer 214 is oxidized by the thermal oxidation process, thereby forming the silicon germanium oxide (SiGeO) feature 324. The second width $w_2$ of the SiGeO feature 324 is in a range of about 3 nm to 10 nm. A center portion of the $SiGe_{x_1}$ layer 214 changes to a second Ge composition $x_2$, which is much higher than $x_1$. A size and shape of the center portion of $SiGe_{x_2}$ vary with process conditions, such as thermal oxidation temperature and time. Also the second Ge composition $x_2$ in the center portion is higher than other portions, such as a top portion, a bottom portion, a left side portion and a right side portion.

Figure 6B:
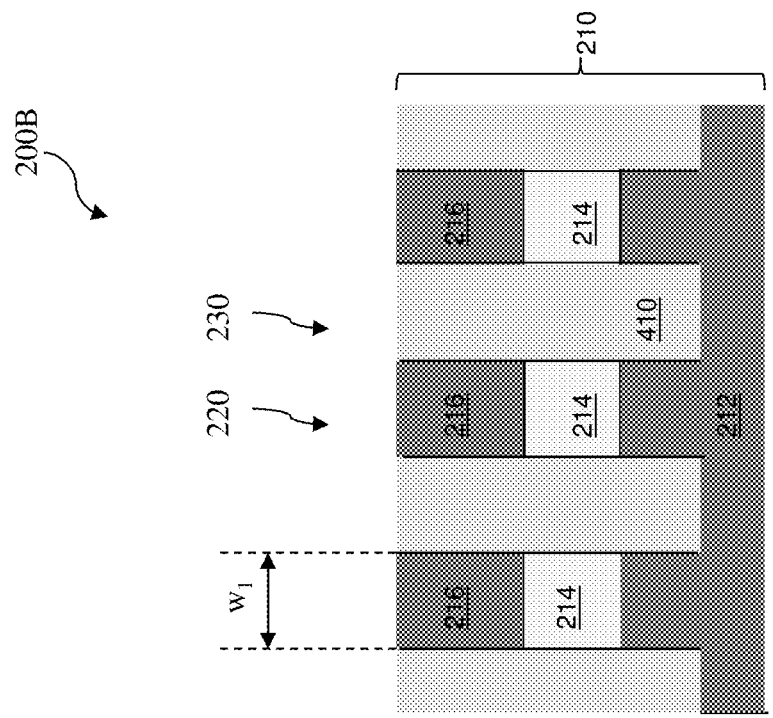
FIG. 6B is a cross-sectional view of an example SRAM FinFET device along the line B-B in FIG. 4B at fabrication stages constructed according to the method of FIG. 1.
Figure 6A:
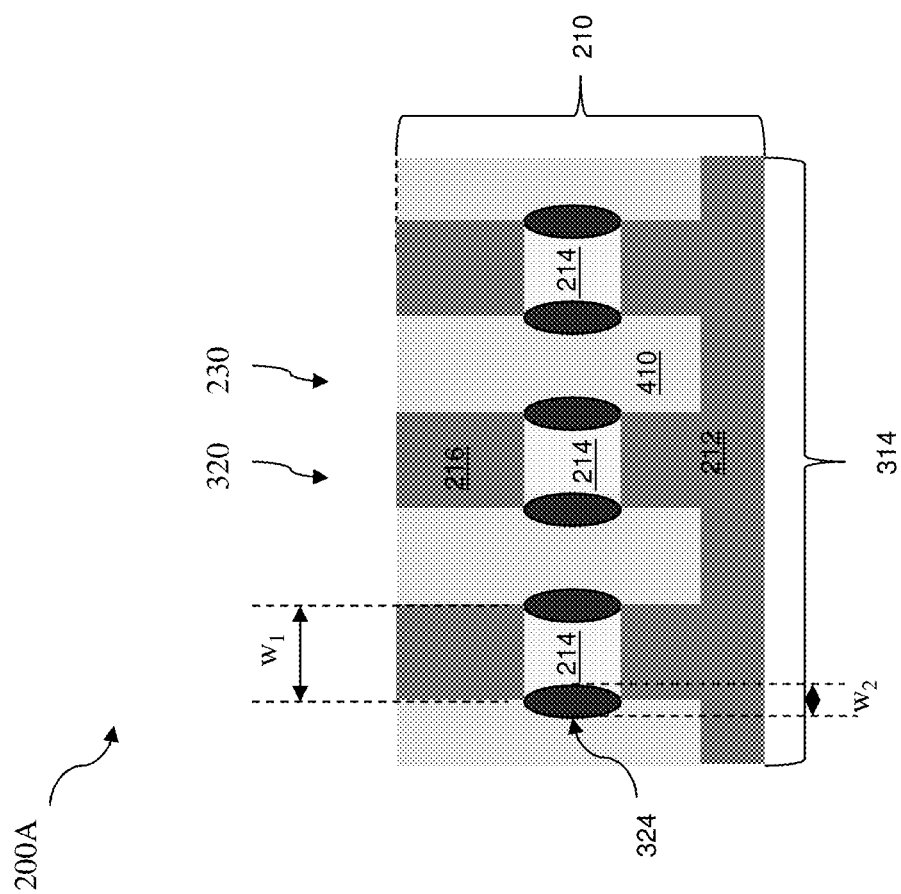
FIG. 6A is a cross-sectional view of an example SRAM FinFET device along the line A-A in FIG. 4A at fabrication stages constructed according to the method of FIG. 1.

Referring to FIGS. 1 and 6A-6B, the method 100 proceeds to step 110 by depositing a dielectric layer 410 over the substrate 210, including filling in the trench 230, in both of the NFET 200A and the PFET 200B. First, the patterned OHM layer 310 is removed by an etching process, such as a selective wet etch. The dielectric layer 410 may include silicon oxide, silicon nitride, silicon oxynitride, other suitable materials, or combinations thereof. The dielectric layer 410 may be deposited by CVD, physical vapor deposition (PVD), ALD, thermal oxidation, other suitable techniques, or a combination thereof.

Figure 7B:
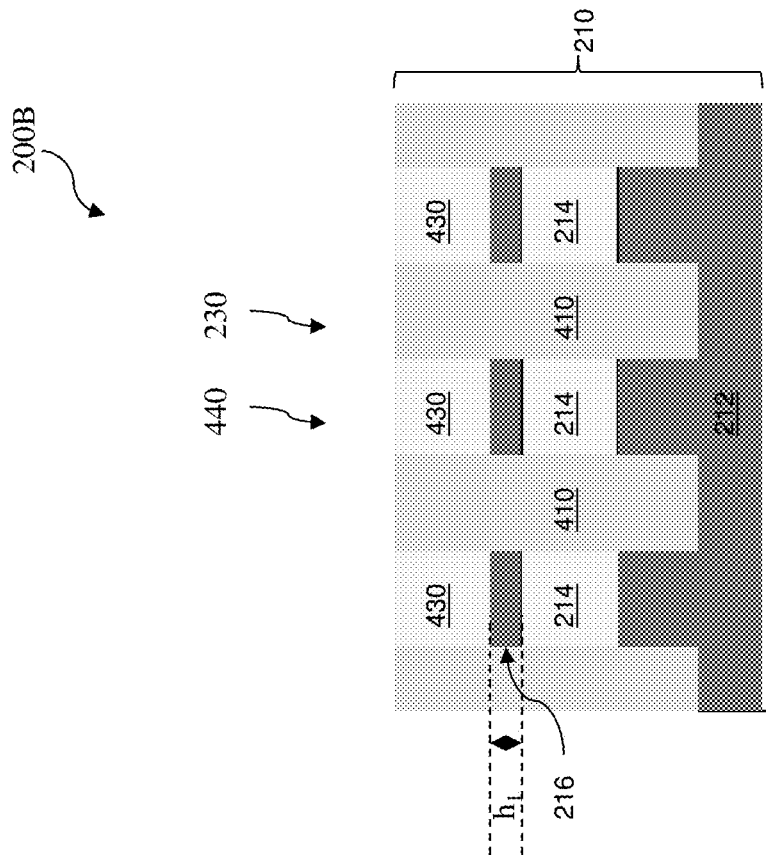
FIGS. 7A and 7B are diagrammatic perspective views of a SRAM FinFET device undergoing processes in accordance with some embodiments.
Figure 7A:
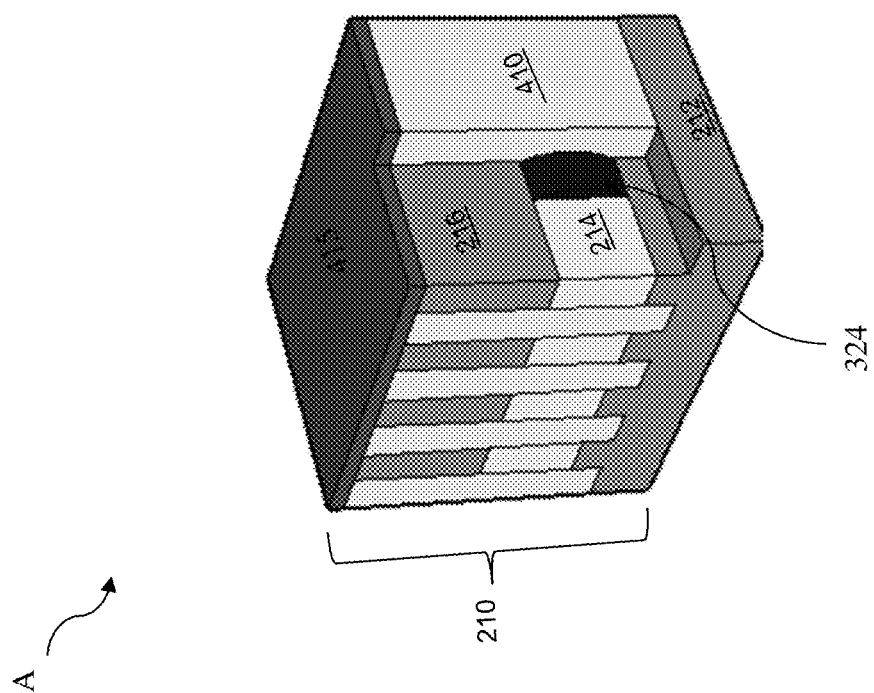

Referring to FIGS. 1 and 7A-7B, the method 100 proceeds to step 112 by covering the NFET 200A with a patterned hard mask (HM) layer 415, forming a third fin structure 440 in the PFET device 200b. The patterned HM layer 415 may include silicon nitride, silicon oxynitride, silicon carbide, or any other suitable dielectric material. The patterned HM layer 415 may be formed similarly to forming of the patterned OHM layer 310 in step 106. In the present embodiment, the patterned HM layer 415 covers the NFET device 200A and leave the PFET device 200B be uncovered.

In the PFET device 200B, the third semiconductor material layer 216 in the first fin structure 220 is recessed by a proper etching process, such as a selective wet etch, a selective dry etch, or a combination thereof. In present embodiment, the recessing process is controlled to leave the remaining third semiconductor material layer 216 have a first height $h_1$ for gaining process integration flexibility. The fourth semiconductor material layer 430 is then deposited over the recessed third semiconductor material layer to form a third fin structure 440. The fourth semiconductor material layer 430 may be deposited by epitaxial growth. The epitaxial process may include CVD deposition techniques, molecular beam epitaxy, and/or other suitable processes. The fourth semiconductor material layer 430 may include germanium (Ge), silicon (Si), gallium arsenide (GaAs), aluminum gallium arsenide (AlGaAs), silicon germanium (SiGe), gallium arsenide phosphide (GaAsP), or other suitable materials. In the present embodiment, the fourth semiconductor material layer 430 is same as the second semiconductor material layer 214, SiGe. Thus the third fin structure 440 is formed to have the fourth semiconductor material layer 430 as its upper portion, the third semiconductor material layer 216 as its upper middle portion, the second semiconductor material layer 214 as its lower middle portion and the first semiconductor material layer 212 as its bottom portion.

A CMP process may be performed thereafter to remove excessive the fourth semiconductor material layer 430 and planarize the top surface of the PFET device 200B. The HM layer 415 in the NFET device 200A is removed by a proper etching process, such as a wet etch, a dry etch, or a combination thereof.

Referring to FIGS. 1 and 8A-8E, the method 100 proceeds to step 114 by recessing the dielectric layer 410 in both of the NFET device 200A and the PFET device 200B. First, the patterned HM layer 415 is removed from the NFET device 200A by a proper etching process, such as a selective wet etch, or a selective dry etch. The dielectric layer 410 is then recessed in both of the NFET device 200A and the PFET device 200B to expose the upper portion of the first fin structure 220 (in the NFET device 200A) and the upper portion of the third fin structure 440 (in the PFET device 200B). In the present embodiment, the recessing processes are controlled to have a top surface of the remaining dielectric layer 410 above the second semiconductor material layer 214 with a first distance $d_1$ for gaining process integration flexibility. In the present embodiment, the remaining dielectric layer 410 in the trench 230 forms shallow trench isolation (STI) features.

In some embodiments, the SRAM FinFET device 200 includes source/drain (S/D) regions and gate regions. In furtherance of the embodiment, one of the S/D regions is a source region, and another of the S/D regions is a drain region. The S/D regions are separated by the gate region. For the sake of clarity to better description, the S/D regions and the gate regions in the NFET device 200A are referred to as a first S/D regions 450A and a first gate regions 460A; the S/D regions and the gate regions in the PFET device 200B are referred to as a second S/D regions 450B and a second gate regions 460B.

Figure 9A:
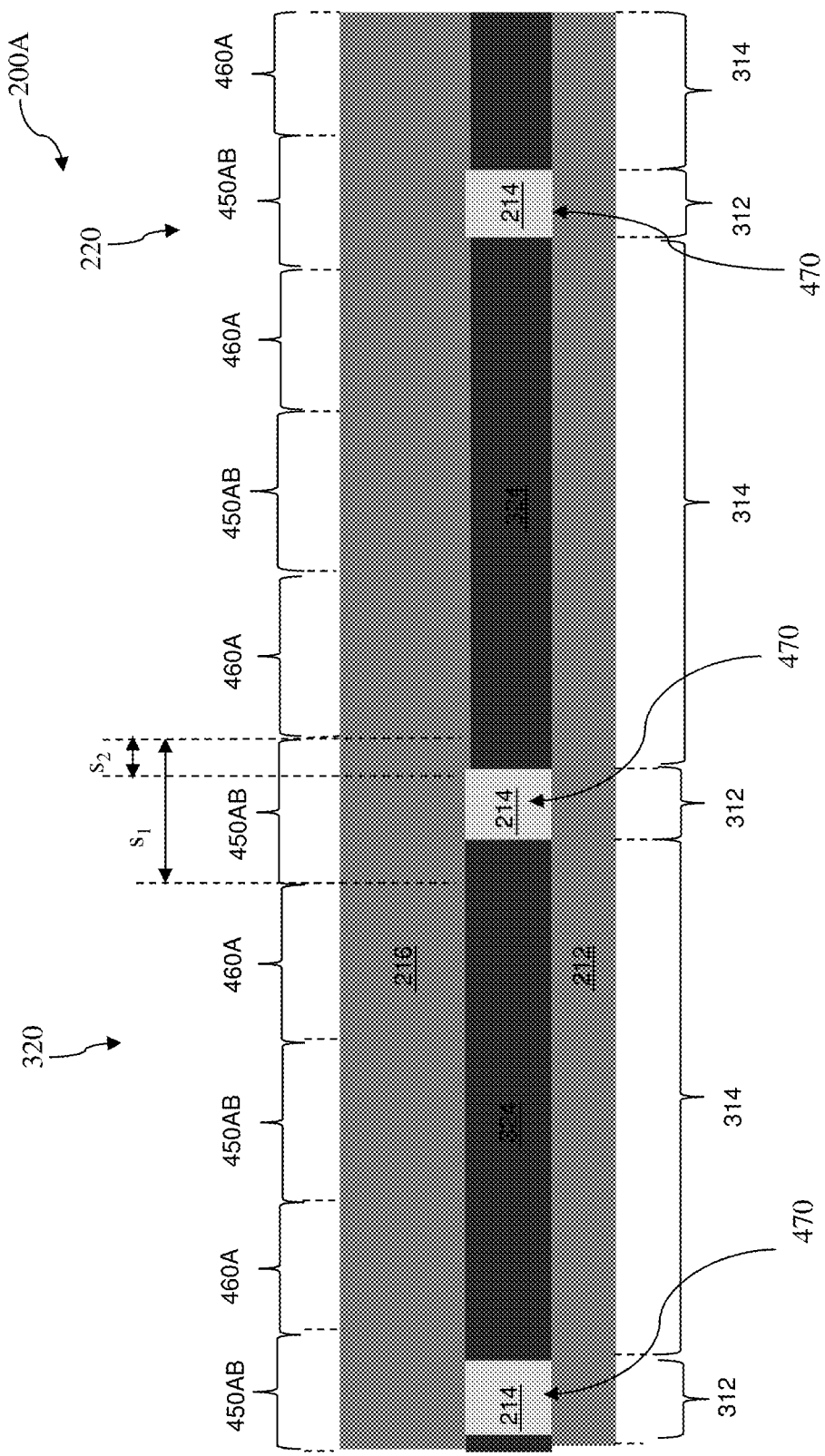
FIG. 9A is a cross-sectional view of an example SRAM FinFET device along the line AB-AB in FIG. 8A at fabrication stages constructed according to the method of FIG. 1.

Referring to FIG. 9A, in the NFET device 200A, the first S/D regions 450A are separated by the first gate regions 460A. In the present embodiment, the first S/D region 450A includes a first subset of the first S/D regions 450AA and a second subset of the first S/D regions 450AB. The first subset of the first S/D regions 450AA are formed in the first region 312 and the second subset of the first S/D regions 450AB are formed in both of the first region 312 and the second region 314, such that the first region 312 locates in the middle and the second region 314 locates symmetrically beside the first region 312. The first gate regions 360A are formed in the second region 314. The second region 314 includes the second fin structure 320. The first region 312 includes the first fin 220.

In the present embodiment, the second semiconductor material layer 214 in the first region 312 is referred to as an anchor 470. The second subset of the first S/D region 450AB has a first space $s_1$. A difference between a width of the anchor 370 and the first space $s_1$ is a second space $s_2$. The second space $s_2$ is in a range of abut 10% to about 25% of the first space $s_1$. The anchor 370 is designed to be between two first gate regions 460A in a periodic matter, such as every two first gate regions 460A, or every three first gate regions 460A, or every fourth first gate regions 460A, and so on.

Figure 9B:
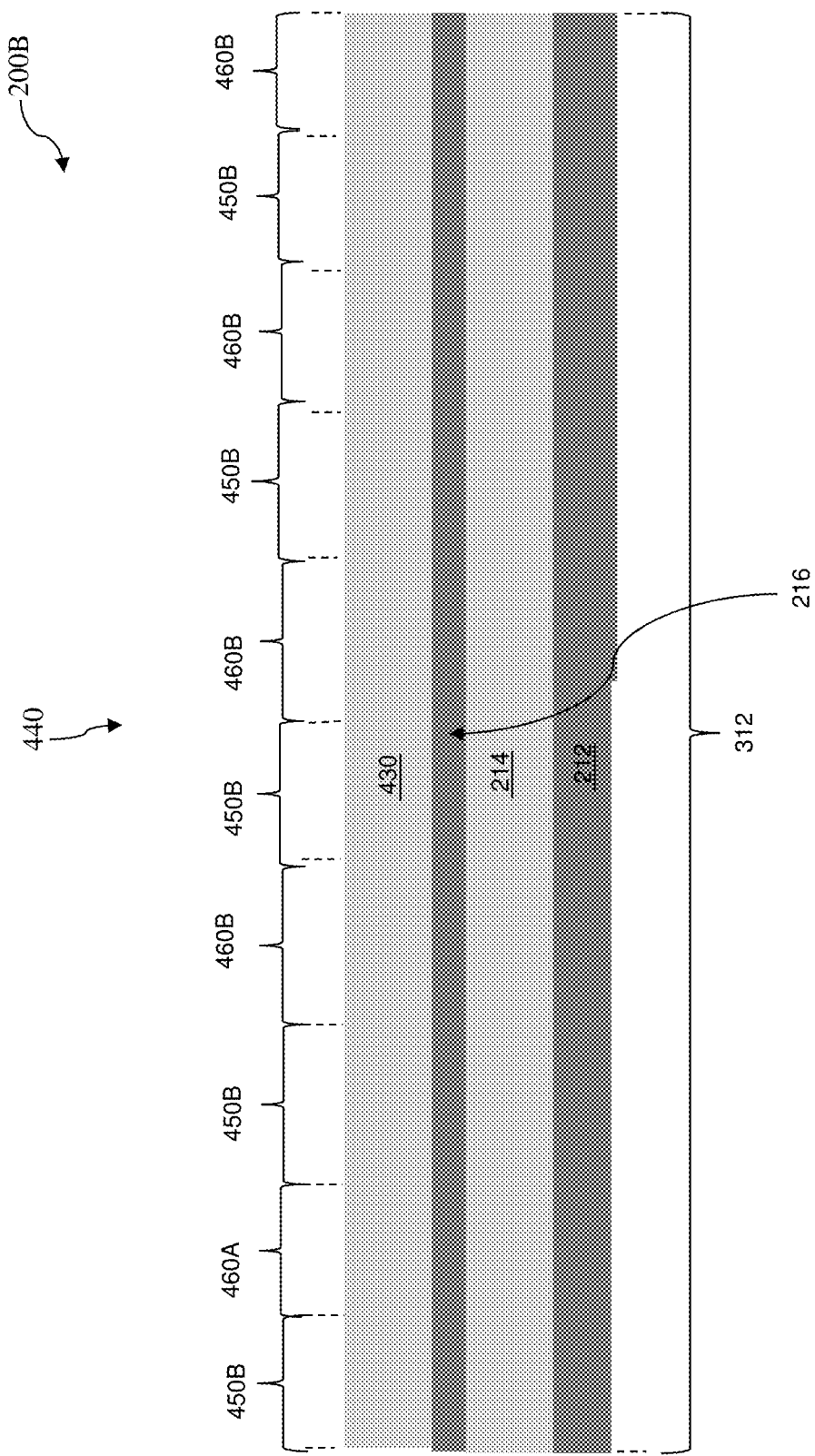
FIG. 9B is a cross-sectional view of an example SRAM FinFET device along the line BB-BB in FIG. 8B at fabrication stages constructed according to the method of FIG. 1.

Referring to FIG. 9B, in the PFET device 200B, the second S/D regions 450B are separated by the second gate regions 460B. The second S/D regions 450B and the second gate region 460B are formed in the first region 312. The first region 312 includes the first fin structure 220.

Figure 10B:
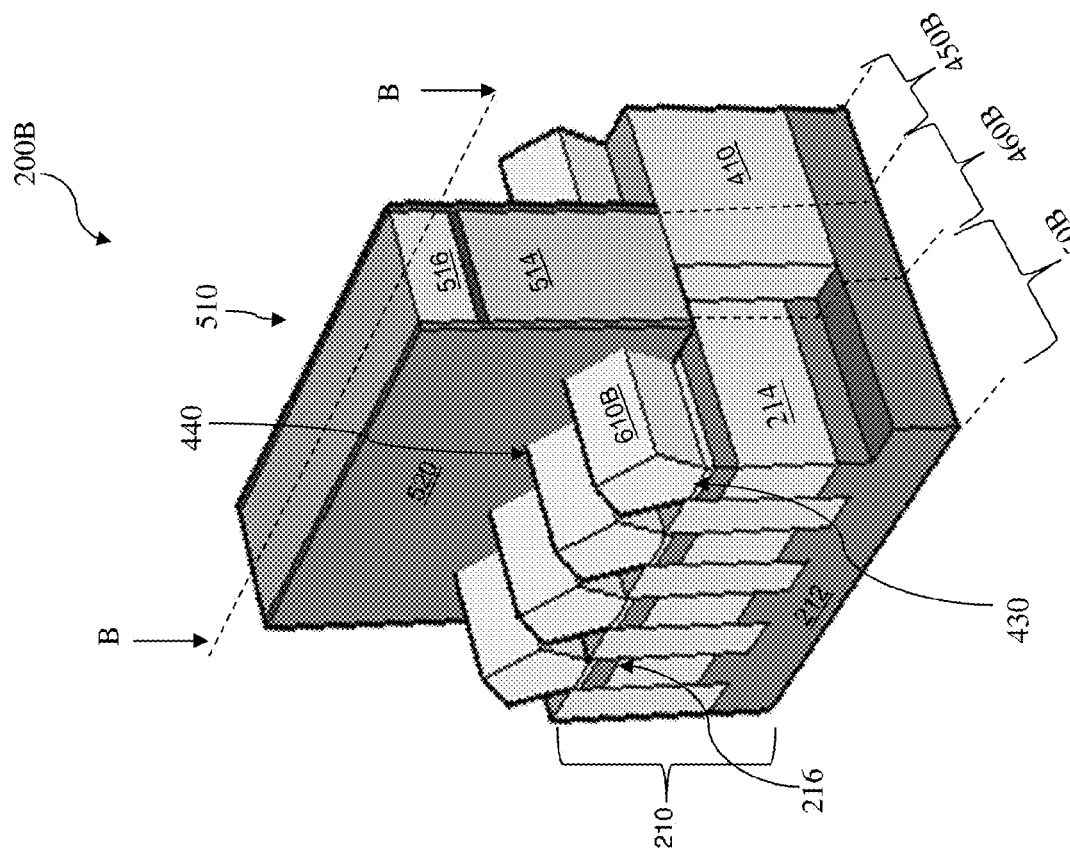
FIGS. 10A and 10B are diagrammatic perspective views of a SRAM FinFET device undergoing processes in accordance with some embodiments.
Figure 10A:
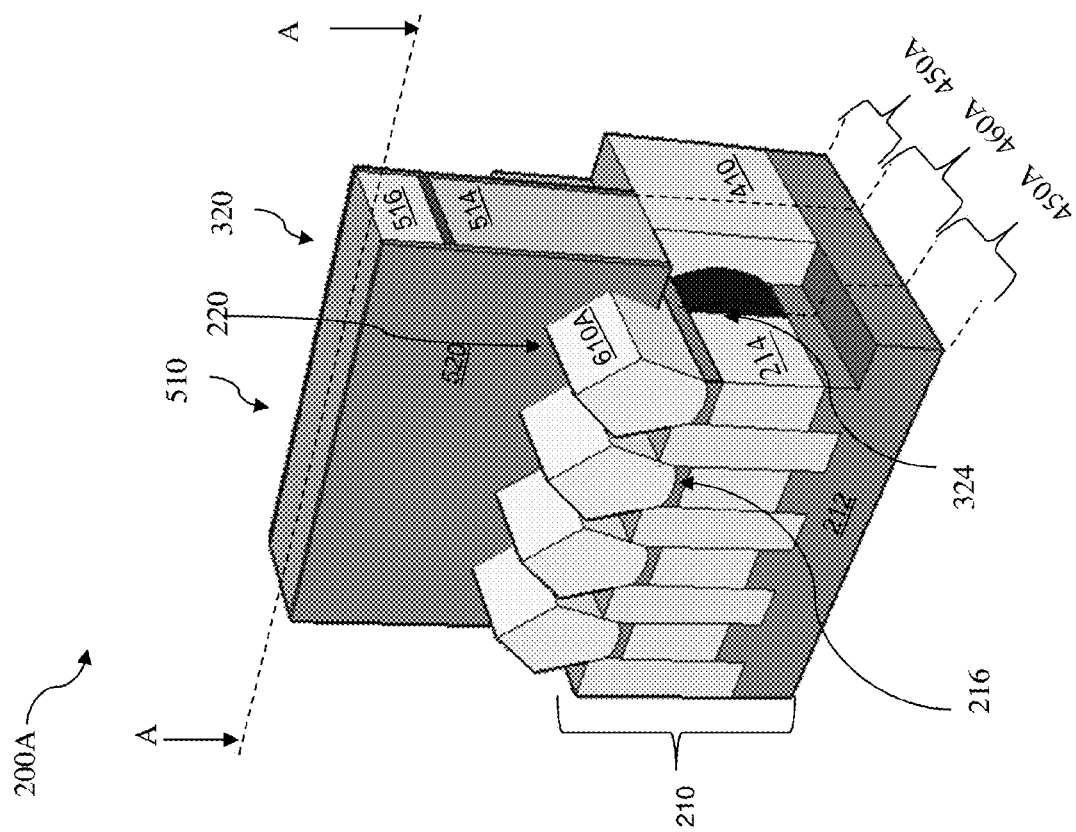

Referring to FIGS. 1 and 10A-10B, the method 100 proceeds to step 116 by forming a gate stack 510 and sidewall spacers 520 on sidewalls of the gate stack 510, in the first and second gate regions, 460A and 460B. In one embodiment using a gate-last process, the gate stack 510 is a dummy gate and will be replaced by the final gate stack at a subsequent stage. Particularly, the dummy gate stacks 510 are to be replaced later by a high-k dielectric layer (HK) and metal gate electrode (MG) after high thermal temperature processes, such as thermal annealing for S/D activation during the sources/drains formation. The dummy gate stack 510 is formed on the substrate 210 and is partially disposed over the second fin structure 320 in the first gate region 460A and the third fin structure 440 in the second gate region 460B. In one embodiment, the dummy gate stack 510 includes a dielectric layer 512, an electrode layer 514 and a gate hard mask (GHM) 516. The dummy gate stack 510 is formed by a suitable procedure including deposition and patterning. The patterning process further includes lithography and etching. In various examples, the deposition includes CVD, physical vapor deposition (PVD), ALD, thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching).

The dielectric layer 512 includes silicon oxide. Alternatively or additionally, the dielectric layer 512 may include silicon nitride, a high-k dielectric material or other suitable material. The electrode layer 514 may include polycrystalline silicon (polysilicon). The GHM 516 includes a suitable dielectric material, such as silicon nitride, silicon oxynitride or silicon carbide. The sidewall spacers 520 may include a dielectric material such as silicon oxide, silicon nitride, silicon carbide, silicon oxynitride, or combinations thereof. The sidewall spacers 520 may include a multiple layers. Typical formation methods for the sidewall spacers 520 include depositing a dielectric material over the gate stack 510 and then anisotropically etching back the dielectric material. The etching back process may include a multiple-step etching to gain etch selectivity, flexibility and desired overetch control.

Referring again to FIGS. 1 and 10A-10B, the method 100 proceeds to step 118 by forming a first S/D features 610A in the first S/D regions 450 A and a second S/D features 610B in the second S/D regions 450B. In one embodiment, the first S/D features 610A is formed by recessing a portion of the upper portion of the first fin structures 220 in the first subset of the first S/D region 450AA and the second fin structures 320 in the second subset of the first S/D region 450AB. The second S/D features 610B is formed by recessing a portion of the upper portion of the third fin structures 440 in the second S/D region 450B. In one embodiment, the first fin structure 220, the second fin structure 320 and the third fin structure 440 are recessed in one etching process. In another embodiment, the first fin structure 220, the second fin structure 320 and the third fin structure 440 are recessed in different etching processes. In present embodiment, for gaining process integration flexibility. the recessing process is controlled to have a portion of the third semiconductor material layer 216 remain in the first fin structure 220 and the second fin structure 320 and have a portion of the fourth semiconductor material layer 430 remain in the third fin structure 440.

The first S/D features 610A and the second S/D features 610B are then epitaxially grow on the recessed first fin structure 220 in the first subset of the first S/D region 450AA, the recessed second fin structure 320 in the second subset of first S/D region 450AB and the recessed third fin structure 440 in the second S/D region 450B. The first and the second S/D features, 610A and 610B, include Ge, Si, GaAs, AlGaAs, SiGe, GaAsP, or other suitable material. The first and the second S/D features, 610A and 610B, may be formed by one or more epitaxy or epitaxial (epi) processes. The first and the second S/D features, 610A and 610B, may also be doped, such as being in-situ doped during the epi processes. Alternatively, the first and the second S/D features, 610A and 610B, are not in-situ doped and implantation processes (i.e., a junction implant process) are performed to dope the first and the second S/D features, 610A and 610B.

In one embodiment, the first S/D features 610A is formed by the epitaxially grown Si layer doped with carbon to form $Si:C_z$ as a lower portion of the first S/D features 610A and the epitaxial grown Si layer doped with phosphorous to form Si:P as an upper portion of the first S/D features 610A, where z is carbon composition in atomic percent. In one embodiment, z is in a range of about 0.5% to about 1.5%. The $Si:C_z$ has a thickness, which is in a range of about 5 nm to about 15 nm. The Si:P has a thickness, which is in a range of about 20 nm to 35 nm. In another embodiment, the second S/D features 610B is formed by the epitaxially grown SiGe layer doped with boron to form $SiGe_\alpha B$, where α is germanium composition in atomic percent. In one embodiment, α is in a range of about 60% to about 100%.

Figure 11B:
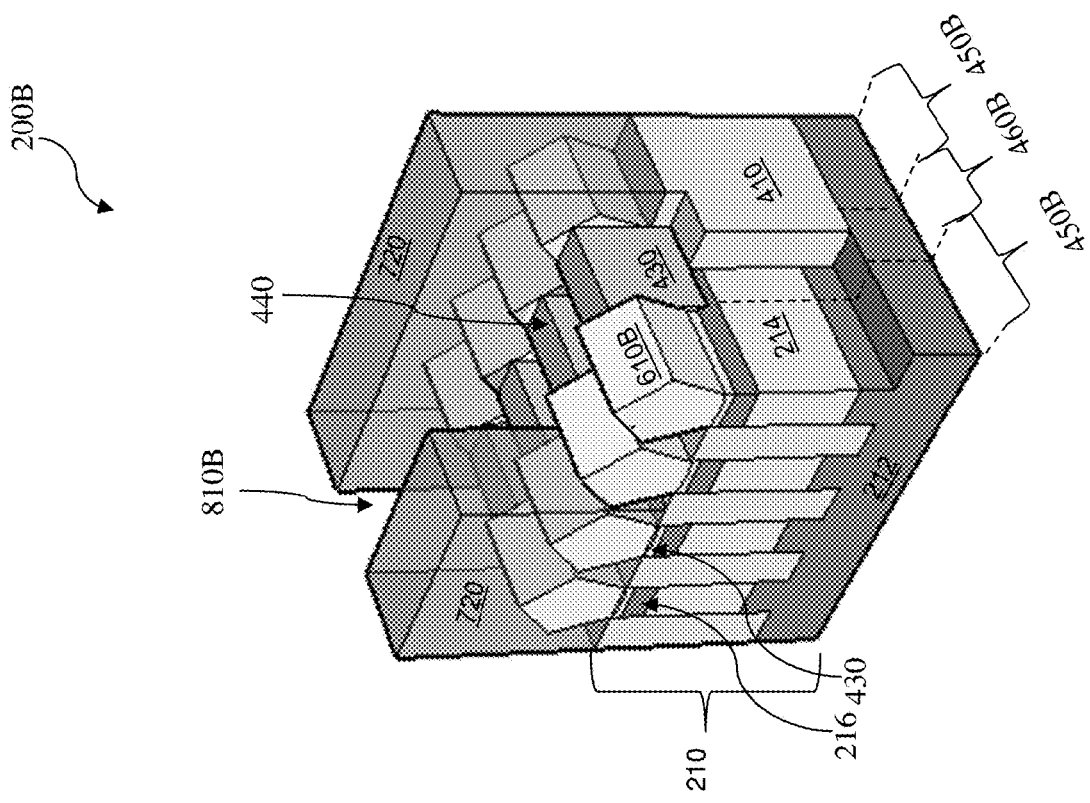
FIGS. 11A and 11B are diagrammatic perspective views of a SRAM FinFET device undergoing processes in accordance with some embodiments.
Figure 11A:
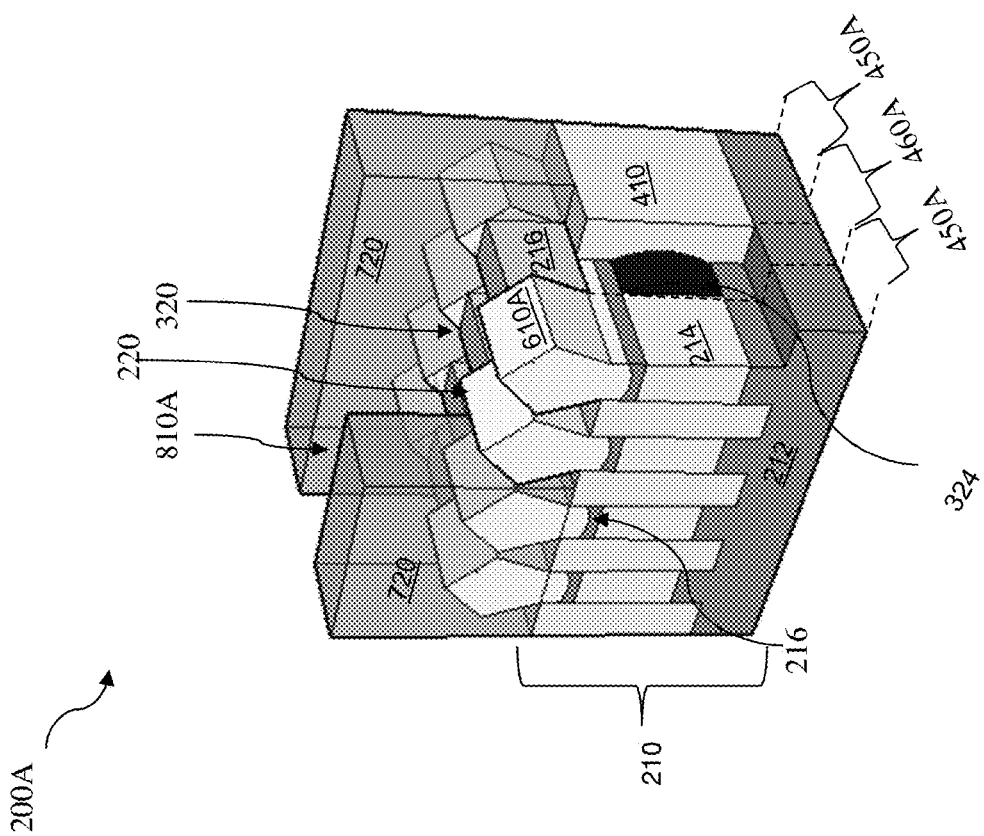

Referring to FIGS. 1 and 11A-11B, the method 100 proceeds to step 120 by forming an interlayer dielectric (ILD) layer 720 on the substrate 210 between the gaps of the dummy gate stacks 510. The ILD layer 720 includes silicon oxide, silicon oxynitride, low k dielectric material or other suitable dielectric materials. The ILD layer 720 may include a single layer or alternative multiple layers. The ILD layer 720 is formed by a suitable technique, such as CVD, ALD and spin-on (SOG). A chemical mechanical polishing (CMP) process may be performed thereafter to remove excessive ILD layer 720 and planarize the top surface of the SRAM FinFET device 200.

Referring also to FIGS. 1 and 11A-11B, the method 100 proceeds to step 122 by removing the dummy gate stacks 510 in the first gate region 460A to form one or more first gate trench 810A and in the second gate region 460B to form one or more second gate trench 810B. The upper portion of the second fin structure 320 is exposed in the first gate trench 810A and the upper portion of the third fin structure 440 is exposed in the second gate trench 810B. The dummy gate stacks 510 are removed by an etch process (such as selective wet etch or selective dry etch) designed to have an adequate etch selectivity with respect to the third semiconductor material layer 216 in the first gate trench 810A and the fourth semiconductor material layer 430 in the second gate trench 810B. The etch process may include one or more etch steps with respective etchants. The gate hard mask layer 516 and the spacers 520 are removed as well. Alternatively, the dummy gate stack 510 may be removed by a series of processes including photolithography patterning and etching process.

Referring to FIGS. 1 and 12A-12B, the method 100 proceeds to step 124 by forming a first and a second high-k/metal gate (HK/MG) stacks, 910A and 910B, over the substrate 210, including wrapping over a portion of the second fins structure 320 in the first gate trench 810A and a portion of the third fin structure 440 in the second gate trench 810B, respectively. The first and the second HK/MG stacks, 910A and 910B, include gate dielectric layer and gate electrode on the gate dielectric. In one embodiment, the gate dielectric layer includes a dielectric material layer having a high dielectric constant (HK dielectric layer-greater than that of the thermal silicon oxide in the present embodiment) and the gate electrode includes metal, metal alloy or metal silicide. The formation of the first and the second HK/MG stacks, 910A and 910B, includes depositions to form various gate materials and a CMP process to remove the excessive gate materials and planarize the top surface of the NFET device 200A and the PFET device 200B.

In one embodiment, the gate dielectric layer includes an interfacial layer (IL) deposited by a suitable method, such as atomic layer deposition (ALD), CVD, thermal oxidation or ozone oxidation. The IL includes oxide, HfSiO and oxynitride. A HK dielectric layer is deposited on the IL by a suitable technique, such as ALD, CVD, metal-organic CVD (MOCVD), physical vapor deposition (PVD), other suitable technique, or a combination thereof. The HK dielectric layer may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials. The gate dielectric layers wrap over the upper portion of the second fin structures 320 in the first gate region 460A and the upper portion of the third fin structures 440 in the second gate region 460B.

A metal gate (MG) electrode may include a single layer or alternatively a multi-layer structure, such as various combinations of a metal layer with a work function to enhance the device performance (work function metal layer), liner layer, wetting layer, adhesion layer and a conductive layer of metal, metal alloy or metal silicide). The MG electrode may include Ti, Ag, Al, TiAlN, TaC, TaCN, TaSiN, Mn, Zr, TiN, TaN, Ru, Mo, Al, WN, Cu, W, any suitable materials or a combination thereof. The MG electrode may be formed by ALD, PVD, CVD, or other suitable process. The MG electrode may be formed separately for the NFET 200A and the PFET 200B with different metal layers. A CMP process may be performed to remove excessive MG electrode.

Figure 13A:
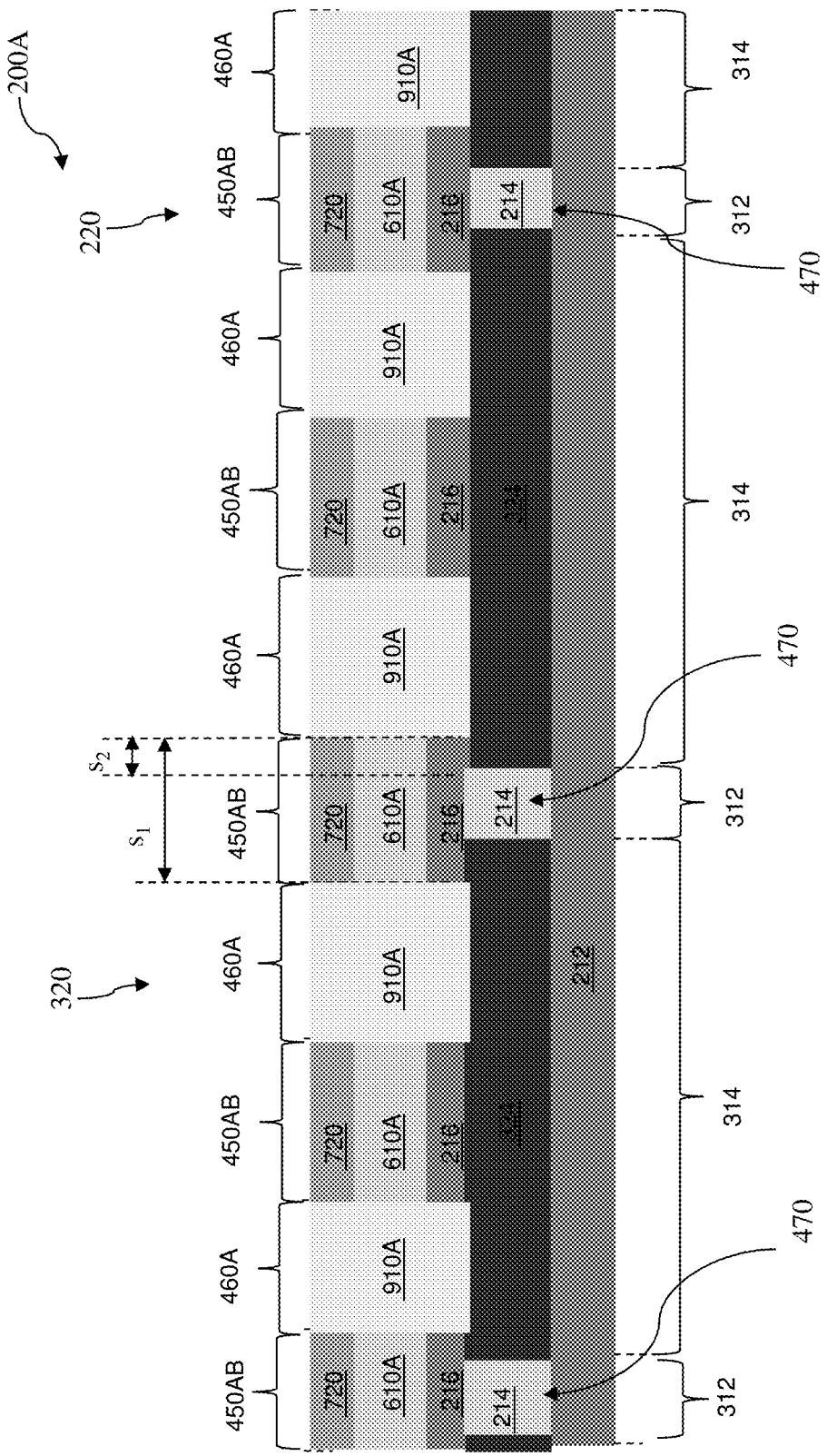
FIG. 13A is a cross-sectional view of an example SRAM FinFET device along the line AB-AB in FIG. 12A at fabrication stages constructed according to the method of FIG. 1.

Referring to FIG. 13A, in the NFET device 200A, the first gate region 460A includes the first HM/MG 910A, which wraps over the upper portion of the second fin structure 320. The second fin structure 320 includes the semiconductor material layer 216 as its upper portion, the second semiconductor material layer 214 (with a semiconductor oxide feature 324 at its outer layer) as its middle portion, and the first semiconductor material layer 212 as its bottom portion. Therefore, during forming the second semiconductor oxide feature 324 in the second fin structure 320, a proper strain is induced to the first gate region 460A and it will increase mobility in a channel region in the first gate region 460A. In the present embodiment, the second subset of the first S/D region 450AB, equipped with the anchors 470 in a periodical matter, which will enhance strain induced to the first gate region 460A and mobility in the channel region. The second space s₂ provides an adequate separation between the anchor 470 and the first gate region 460A to avoid adverse impacts, such as induced interface states in the first HK/MG 910 by the anchor 470.

Figure 13B:
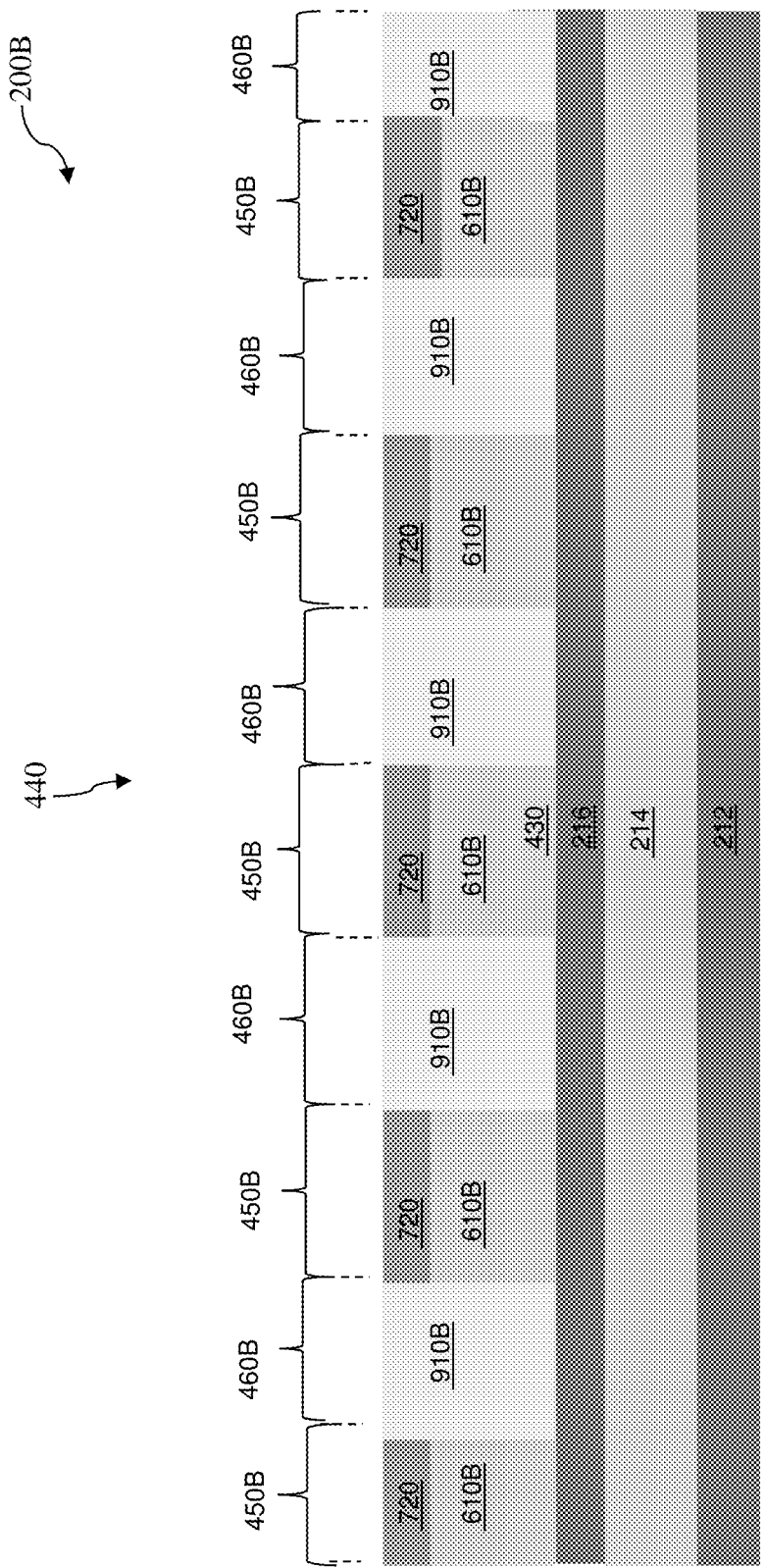
FIG. 13B is a cross-sectional view of an example SRAM FinFET device along the line BB-BB in FIG. 12B at fabrication stages constructed according to the method of FIG. 1.

Referring to FIG. 13B, in the PFET device 200B, the second S/D region 450B are separated by the second gate region 460B. The second gate region 460B includes the second HK/MG 910B wraps over the upper portion of the third fin structure 440. The third fin structure 440 includes the fourth semiconductor material layer 430 as its upper portion, the third semiconductor material layer 216 as its upper middle portion, the second semiconductor material layer 214 as its lower middle portion, and the first semiconductor material layer 212 as its bottom portion.

The SRAM FinFET device 200 may undergo further CMOS or MOS technology processing to form various features and regions known in the art. For example, subsequent processing may form various contacts/vias/lines and multilayers interconnect features (e.g., metal layers and interlayer dielectrics) on the substrate 210, configured to connect the various features to form a functional circuit that includes one or more SRAM FinFET field-effect transistors. In furtherance of the example, a multilayer interconnection includes vertical interconnects, such as vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Additional operations may be implemented before, during, and after the method 100, and some operations described above may be replaced or eliminated for other embodiments of the method.

Based on the above, the present disclosure offers structures of a SRAM FinFET. The structures employ technique of volume expansion and periodic anchor structures in its NFET device to induce an efficient strain to the gate region to improve device performance.

The present disclosure provides an embodiment of a fin-like field-effect transistor (FinFET) device. The device includes a substrate having an n-type FinFET (NFET) region and a p-type FinFET (PFET) region. The device also includes a first fin structure over the substrate in the NFET region, a second fin structure over the substrate in the NFET region and a third fin structure over the substrate in the PFET region. The device also includes a first high-k (HK)/metal gate (MG) stack over the substrate in the NFET region, including wrapping over a portion of the first fin structure. The device also includes a first subset of source/drain (S/D) features, adjacent to the first HK/MG stack, over the recessed first fin structure m a second subset of S/D features partially over the recessed second fin structure and partially over the recessed first fin structure, which around the recessed second fin structure, adjacent to another first HK/MG stack. The device also includes a second HK/MG) stack over the substrate in the PFET region, including wrapping over a portion of the third fin structure and a second S/D features, adjacent to the second HK/MG stack, over the recessed third fin structure in the PFET region.

The present disclosure also provides another embodiment of a fin-like field-effect transistor (FinFET) device. The device includes a substrate having an n-type fin-like field-effect transistor (NFET) region and a p-type fin-like field-effect transistor (PFET) region. The device also includes a first fin structure over the substrate in the NFET gate region. The first fin structure includes an epitaxial silicon (Si) layer as its upper portion and an epitaxial silicon germanium (SiGe), with a silicon germanium oxide (SiGeO) feature at its outer layer, as its lower portion. The device also includes a second fin structure over the substrate in the NFET region. The second fin structure includes an epitaxial silicon (Si) layer as its upper portion and an epitaxial silicon germanium (SiGe) as its lower portion. The device also includes a third fin structure over the substrate in the PFET region. The third fin structure includes an epitaxial SiGe layer as its upper portion, an epitaxial Si as its middle portion and another epitaxial SiGe layer as its bottom portion. The device also includes a first subset of source/drain (S/D) regions in a portion of the first fin structure, a second subset of S/D regions in a portion of the second fin structure, which is surrounded by the first fin structure and a second S/D regions in a portion of the third fin structures.

The present disclosure also provides a method for fabricating a FinFET. The method includes providing a substrate having an n-type fin-like field-effect transistor (NFET) region and a p-type fin-like field-effect transistor (PFET) region. The method also includes forming first fin structures in the NFET region and the PFEN region. The first fin structure includes a first epitaxial semiconductor material layer as its upper portion, a second epitaxial semiconductor material layer, with a semiconductor oxide feature at its outer layer, as its middle portion and a third semiconductor material layer as its bottom portion. The method also includes forming a patterned oxidation-hard-mask (OHM) over the NFET region and PFEN region to expose the first fin structure in a first gate region of the NFET region, applying annealing to form a semiconductor oxide feature at out layer of the second semiconductor material layer in the first fin structure in the first gate region, depositing a dielectric layer between the first fins, forming a third fin structure in the PNFET device while covering the NFET device with a hard mask layer, recessing the dielectric layer in both of the NFET region and the PFET region, forming dummy gates in a first gate region and a second gate region in the second fin structure, forming a first source/drain (S/D) features in a first S/D region in the first fin structure and in the second fin structure in the NFET region and forming a second S/D feature in a second S/D region in the third fin structure in the PFET region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A transistor device comprising:
   a substrate having an n-type fin field-effect transistor (NFET) region and a p-type fin field-effect transistor (PFET) region;
   a first fin structure in the NFET region, the first fin structure including:
      a first semiconductor material layer as its upper portion;
      a second semiconductor material layer as its lower portion; and
      an oxide layer on a side surface of its lower portion;

a second fin structure in the NFET region, the second fin structure including:
  the first semiconductor material layer as its upper portion; and
  the second semiconductor material layer as its lower portion, wherein the second fin structure joins the first fin structure and is free of the oxide layer;
a third fin structure over the substrate in the PFET region, the third fin structure including:
  a third semiconductor material layer as its upper portion;
  the first semiconductor material layer as its middle portion; and
  the second semiconductor material layer as its bottom portion, wherein the third fin structure is free of the oxide layer;
a first source/drain (S/D) feature disposed over the first fin structure;
a second S/D feature disposed over both the first and second fin structures; and
at least two high-k/metal gate (HK/MG) stacks disposed over the first fin structure, wherein one of the HK/MG stacks is disposed between the first and second S/D features.

2. The device of claim 1, wherein the second fin structure is free of gate stacks directly above.

3. The device of claim 1, further comprising a fourth fin structure disposed over the substrate in the NFET region, wherein the fourth fin structure includes:
  the first semiconductor material layer as its upper portion;
  the second semiconductor material layer as its lower portion; and
  the oxide layer on a side surface of its lower portion, wherein the second S/D feature is further disposed over the fourth fin structure.

4. A fin field-effect transistor (FinFET) device comprising:
  a substrate having an n-type fin field-effect transistor (NFET) region and a p-type fin field-effect transistor (PFET) region;
  a first fin structure over the substrate in the NFET region, the first fin structure including:
    a first semiconductor material layer as its upper portion;
    a second semiconductor material layer as its lower portion; and
    an oxide layer on a side surface of its lower portion;
  a second fin structure over the substrate in the NFET region, the second fin structure including:
    the first semiconductor material layer as its upper portion; and
    the second semiconductor material layer as its lower portion, wherein the second fin structure joins the first fin structure and is free of the oxide layer;
  a third fin structure over the substrate in the PFET region, the third fin structure including:
    a third semiconductor material layer as its upper portion;
    the first semiconductor material layer as its middle portion; and
    the second semiconductor material layer as its bottom portion;
  a first source/drain (S/D) feature over the first fin structure;
  a second S/D feature over both the second fin structure, and the first fin structure.

5. The device of claim 4, wherein a width of a portion of the first fin structure underneath the second S/D features is 10% to 25% of a width of the second S/D feature.

6. The device of claim 4, wherein the second fin structure is free of gate stacks directly above.

7. The device of claim 4, further comprising:
  at least two HK/MG stacks wrapping at least a portion of the upper portion of the first fin structure.

8. The device of claim 7, wherein the HK/MG stacks are disposed above the oxide layer.

9. The device of claim 4, further comprising a fourth fin structure disposed over the substrate in the NFET region, wherein the fourth fin structure includes:
  the first semiconductor material layer as its upper portion;
  the second semiconductor material layer as its lower portion; and
  the oxide layer on a side surface of its lower portion, wherein the second fin structure joins both the first and fourth fin structures.

10. The device of claim 9, wherein the second S/D feature is also disposed over the fourth fin structure.

11. The device of claim 10, wherein:
  the first semiconductor material layer includes silicon;
  the second semiconductor material layer includes silicon germanium;
  the oxide layer includes silicon germanium oxide; and
  the third semiconductor material layer includes silicon germanium.

12. A fin field-effect transistor (FinFET) device comprising:
  a substrate having an n-type FinFET (NFET) region and a p-type FinFET (PFET) region;
  a first fin structure over the substrate in the NFET region, the first fin structure including:
    a first semiconductor material layer as its upper portion;
    a second semiconductor material layer as its lower portion; and
    an oxide layer on a side surface of its lower portion;
  a second fin structure disposed over the substrate in the NFET region and joining the first fin structure, wherein the first and second fin structures have different compositions;
  a third fin structure disposed over the substrate in the PFET region;
  at least two first high-k (HK)/metal gate (MG) stacks disposed above the oxide layer and at least partially wrapping the upper portion of the first fin structure;
  first source/drain (S/D) features disposed adjacent to the first HK/MG stacks, wherein a first one of the first S/D features is disposed over the first fin structure and a second one of the first S/D features is disposed over both the second fin structure and a first portion of the first fin structure;
  a second HK/MG stack disposed over the third fin structure; and
  a second S/D feature, disposed adjacent to the second HK/MG stack and over the third fin structure.

13. The device of claim 12, wherein the second fin structure includes:
  the first semiconductor material as its upper portion; and
  the second semiconductor material layer as its lower portion.

14. The device of claim 12, wherein the third fin structure includes:
  a third semiconductor material layer as its upper portion;
  the first semiconductor material layer as its middle portion; and the second semiconductor material layer as its bottom portion.

15. The device of claim 12, wherein a width of the first portion of the first fin structure is 10% to 25% of a width of the second one of the first S/D features.

16. The device of claim 12, wherein:
the first semiconductor material layer includes silicon;
the second semiconductor material layer includes silicon germanium; and
the oxide layer includes silicon germanium oxide.

17. The device of claim 12, wherein the second one of the first S/D features is disposed over an entire width of the second fin structure.

18. The device of claim 12, wherein the second fin structure is free of the oxide layer.

19. The device of claim 12, further comprising a fourth fin structure disposed over the substrate in the NFET region, wherein the fourth fin structure includes:
the first semiconductor material layer as its upper portion;
the second semiconductor material layer as its lower portion; and
the oxide layer on a side surface of its lower portion, wherein the second fin structure joins both the first and fourth fin structures.

20. The device of claim 19, wherein the second one of the first S/D features is also disposed over a second portion of the fourth fin structure.

21. The device of claim 20, wherein the first portion of the first fin structure and the second portion of the fourth fin structure have about the same width.

* * * * *